(12) United States Patent
Hill

(10) Patent No.: US 6,757,066 B2
(45) Date of Patent: Jun. 29, 2004

(54) MULTIPLE DEGREE OF FREEDOM INTERFEROMETER

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 10/351,707

(22) Filed: Jan. 27, 2003

(65) Prior Publication Data

US 2003/0164948 A1 Sep. 4, 2003

Related U.S. Application Data

(60) Provisional application No. 60/379,987, filed on May 13, 2002, provisional application No. 60/371,872, filed on Apr. 11, 2002, and provisional application No. 60/352,341, filed on Jan. 28, 2002.

(51) Int. Cl.[7] .................................................. G01B 9/02
(52) U.S. Cl. ..................................... 356/493; 356/498
(58) Field of Search ................................ 356/487, 486, 356/493, 500, 498

(56) References Cited

U.S. PATENT DOCUMENTS

| 4,784,490 A | 11/1988 | Wayne .......................... 356/351 |
| 4,881,815 A | 11/1989 | Sommargren ................ 356/349 |
| 4,881,816 A | * 11/1989 | Zanoni ......................... 356/485 |
| 4,883,357 A | 11/1989 | Zanoni et al. ............... 356/349 |
| 5,064,289 A | 11/1991 | Bockman |
| 5,483,343 A | 1/1996 | Iwamoto et al. ............. 356/351 |
| 5,575,160 A | 11/1996 | Kreuzer ....................... 318/649 |
| 5,801,832 A | 9/1998 | Van Den Brink |
| 6,020,964 A | 2/2000 | Loopstra et al. ............. 356/358 |
| 6,046,792 A | * 4/2000 | Van Der Werf et al. ...... 355/53 |
| 6,271,923 B1 | 8/2001 | Hill |
| 6,552,804 B2 | 4/2003 | Hill ............................. 356/510 |
| 2002/0001087 A1 | 1/2002 | Hill ............................. 356/510 |

* cited by examiner

*Primary Examiner*—Frank G. Font
*Assistant Examiner*—Patrick Connolly
(74) *Attorney, Agent, or Firm*—Fish & Richardson P.C.

(57) ABSTRACT

An apparatus includes a multi-axis interferometer for measuring a relative position of a reflective measurement object along multiple degrees of freedom, wherein the interferometer is configured to produce multiple output beams each comprising information about the relative position of the measurement object with respect to a different one of the degrees of freedom. Each output beam includes a beam component that contacts the measurement object at least one time along a common path, and at least one of the beam components further contacts the measurement object at least a second time along a first path different from the common path.

73 Claims, 29 Drawing Sheets

MULTIPLE DEGREE OF FREEDOM INTERFEROMETER

CROSS-REFERENCE TO RELATED APPLICATIONS

This application claims priority to the following U.S. Provisional Patent Applications: U.S. Serial No. 60/352,341 by Henry A. Hill entitled "MULTIPLE-DEGREES OF FREEDOM MEASURING PLANE MIRROR INTERFEROMETER ASSEMBLY" and filed Jan. 28, 2002 (Z-391); U.S. Serial No. 60/371,872 by Henry A. Hill entitled "MULTIPLE DEGREE OF FREEDOM PLANE MIRROR INTERFEROMETER" and filed Apr. 11, 2002 (Z-408); and U.S. Serial No. 60/379,987 by Henry A. Hill entitled "MULTIPLE DEGREE OF FREEDOM HIGH STABILITY PLANE MIRROR INTERFEROMETER" and filed May 13, 2002 (Z-422). Each of the above-referenced Provisional Patent Applications are incorporated herein by reference.

BACKGROUND

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change substantially equal to a distance change L of $\lambda/(np)$, where L is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors and sub-harmonic cyclic errors can also be present.

There are also "non-cyclic non-linearities" such as those caused by a change in lateral displacement (i.e., "beam shear") between the reference and measurement beam components of an output beam of an interferometer when the wavefronts of the reference and measurement beam components have wavefront errors. This can be explained as follows.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

The interferometers described above are often crucial components of scanner systems and stepper systems used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

In many lithography systems and other applications, the measurement object includes one or more plane mirrors to reflect the measurement beam from each interferometer. Small changes in the angular orientation of the measurement object, e.g., pitch and yaw of a stage, can alter the direction of each measurement beam reflected from the plane mirrors. If left uncompensated, the altered measurement beams reduce the overlap of the exit measurement and reference beams in each corresponding interferometer. Furthermore, these exit measurement and reference beams will not be propagating parallel to one another nor will their wave fronts be aligned when forming the mixed beam. As a result, the interference between the exit measurement and reference beams will vary across the transverse profile of the mixed beam, thereby corrupting the interference information encoded in the optical intensity measured by the detector.

To address this problem, many conventional interferometers include a retroreflector that redirects the measurement beam back to the plane mirror so that the measurement beam "double passes" the path between the interferometer and the measurement object. The presence of the retroreflector insures that the direction of the exit measurement is insensitive to changes in the angular orientation of the measurement object. When implemented in a plane mirror interferometer, the configuration results in what is commonly referred to as a high-stability plane mirror interferometer (HSPMI). However, even with the retroreflector, the lateral position of the exit measurement beam remains sensitive to changes in the angular orientation of the measurement object. Furthermore, the path of the measurement beam through optics within the interferometer also remains sensitive to changes in the angular orientation of the measurement object.

In practice, the interferometry systems are used to measure the position of the wafer stage along multiple measurement axes. For example, defining a Cartesian coordinate system in which the wafer stage lies in the x-y plane, measurements are typically made of the x and y positions of the stage as well as the angular orientation of the stage with respect to the z axis, as the wafer stage is translated along the x-y plane. Furthermore, it may be desirable to also monitor tilts of the wafer stage out of the x-y plane. For example, accurate characterization of such tilts may be necessary to calculate Abbe offset errors in the x and y positions. Thus, depending on the desired application, there may be up to five degrees of freedom to be measured. Moreover, in some applications, it is desirable to also monitor the position of the stage with respect to the z-axis, resulting in a sixth degree of freedom.

To measure each degree of freedom, an interferometer is used to monitor distance changes along a corresponding metrology axis. For example, in systems that measure the x and y positions of the stage as well as the angular orientation of the stage with respect to the x, y, and z axes, at least three spatially separated measurement beams reflect from one side of the wafer stage and at least two spatially separated measurement beams reflect from another side of the wafer stage. See, e.g., U.S. Pat. No. 5,801,832 entitled "Method of and Device for Repetitively Imaging a Mask Pattern on a Substrate Using Five Measuring Axes," the contents of which are incorporated herein by reference. Each measurement beam is recombined with a reference beam to monitor optical path length changes along the corresponding metrology axes. Because the different measurement beams contact the wafer stage at different locations, the angular orientation of the wafer stage can then be derived from appropriate combinations of the optical path length measurements. Accordingly, for each degree of freedom to be monitored, the system includes at least one measurement beam that contacts the wafer stage. Furthermore, as described above, each measurement beam may double-pass the wafer stage to prevent changes in the angular orientation of the wafer stage from corrupting the interferometric signal. The measurement beams may generated from physically separate interferometers or from multi-axes interferometers that generate multiple measurement beams.

SUMMARY

The invention features multiple degrees of freedom measuring interferometers, such as ones that measure multiple degrees of freedom of a plane mirror measurement object. For example, the interferometers may be combined into single optical assemblies. Information about changes in position of the measurement object are derived from multiple ouput beams that each include a component that makes one pass to the measurement object along a common measurement beam path. As a result, such interferometer systems can exhibit reduced non-cyclic errors in certain of the measured degrees of freedom that arise from different sources, e.g., relative misalignments of measurement beams with corresponding differing cosine or cosecant correction factors, wave front errors in the presence of beam shears, non-homogeneities in glass in the presence of beam shears, and temperature gradients. Moreover, spatial separations of certain of the measurement beams contacting the plane mirror measurement object need not be determined by the locations of one or more retroreflectors. Also, the interferometer systems generally involve a reduced number of optical elements.

The interferometer systems may be configured so that the measured multiple degrees of freedom are based on combinations of angular and/or linear displacements of the plane mirror measurement object.

The interferometer systems may further be configured such that the directions of input beams to the multiple degree of freedom measuring interferometers are controlled by one or more dynamic beam steering elements to reduce (e.g., substantially eliminate) beam shear in the interferometers and at detectors as the plane mirror measurement object, thereby reducing one source of non-cyclic errors. The interferometer systems may also be configured such that both the directions of input and output beams to and from the multiple degree of freedom measuring interferometers are controlled by one or more beam steering elements to reduce (e.g., substantially eliminate) the beam shear and changes in the angles of incidence of output beams at detectors as the plane mirror measurement object is tilted.

The multi-axis interferometry system can be incorporated into a lithography system for making semiconductor chips. The multi-axis interferometry system can also be incorporated into a beam writing system.

We now summarize different aspects and features of the invention.

In general, in one aspect, the invention features an apparatus including a multi-axis interferometer for measuring a relative position of a reflective measurement object along multiple degrees of freedom, wherein the interferometer is configured to produce multiple output beams each including information about the relative position of the measurement object with respect to a different one of the degrees of freedom. Each output beam includes a beam component that contacts the measurement object at least one time along a common path, and at least one of the beam components further contacts the measurement object at least a second time along a first path different from the common path.

Embodiments of the apparatus may include any of the following features.

The output beam including the beam component that contacts the measurement object along the common path and along the first path may further include a second beam component that does not contact the measurement object.

One of the degrees of freedom may be distance to the measurement object along a first measurement axis. For example, the output beam including information about the distance to the measurement object along the first measurement axis may include the beam component that contacts the measurement object along the common path and along the first path. In such embodiments, the first measurement axis may be defined by the common path and the first path. For example, each point on the first measurement axis may be equidistant to corresponding points on the common path and the first path.

Furthermore, in addition to the distance measurement along the first measurement axis, another of the beam components may further contacts the measurement object at least a second time along a second path different from the common path. The output beam including the beam component that contacts the measurement object along the common path and along the second path may include information about distance to the measurement object along a second measurement axis defined by the common path and the second path, the second measurement axis being different from the first measurement axis. Moreover, a third of the beam components may further contact the measurement object at least a second time along a third path different from the common path. The output beam including the beam component that contacts the measurement object along the common path and the third path may include information about distance to the measurement object along a third measurement axis defined by the common path and the third path, the third measurement axes being different from the first and second measurement axes. For example, the first and second measurement axes may define a first plane, and the second and third measurement axes may define a second plane different from the first plane.

In addition to the distance measurement along the first measurement axis, a second one of the output beams may include information about an angular orientation of the measurement object with respect to a first rotation axis. For example, the second output beam may include the first-mentioned beam component that contacts the measurement object along the common path and another beam component different from the first beam component, wherein the other beam component contacts the measurement object along a second path different from the common path. The first path may different from the second path, or it might be the same as the common path. The first rotation axis may normal to a plane defined by the common path and the second path. Furthermore, a third one of the output beams may include information about an angular orientation of the measurement object with respect to a second rotation axis different from the first rotation axis. The third output beam may include the first-mentioned beam component that contacts the measurement object along the common path and another beam component different from the first beam component, wherein the other beam component in the third output beam contacts the measurement object along a third path different from the common path. For example, the second rotation axis may be normal to the first rotation axis.

The multi-axis interferometer may produces at least four output beams each including information about a different one of the multiple degrees of freedom. Furthermore, the multi-axis interferometer may provides information with respect to at least five degrees of freedom, or even with respect to at least seven degrees of freedom.

The measurement object may include a plane mirror.

The apparatus may further include a light source configured to direct an input beam into the multi-axis interferometer, the input beam including two components having a heterodyne frequency splitting. Each output beam that contacts the measurement object along the common path is derived from one of the components in the input beam, and each output beam further includes a second component derived from the other one of the components in the input beam. For example, the components of the input beam may have orthogonal polarizations.

The apparatus may further include detectors configured to receive the output beams and generate electrical signals indicative of the information about the relative position of the measurement object with respect to the different degrees of freedom. Moreover, the apparatus may further include a polarization analyzer positioned prior to each detector and configured to pass an interfermediate polarization to those of the components in each of the output beams. Also, the apparatus may further include a fiber-optic pick-up for coupling each output beam to a corresponding detector after it passes through the corresponding polarization analyzer.

The interferometer may be configured to direct a first beam derived from an input beam to contact the measurement object along the common path and separate the first beam into multiple sub-beams after it contacts the measurement object, wherein the sub-beams correspond to the beam components in the output beams that contact the measurement object along the common path. Furthermore, the interferometer may be configured to further direct at least one of the sub-beams to contact the measurement object at least a second time along the first path to define the beam component that contacts the measurement object along the common path and along the first path. Moreover, the interferometer may be configured to derive another sub-beam from the input beam and combine the sub-beam that contacts the measurement object at least twice with the other sub-beam to produce a first one of the output beams, wherein the first output beam includes information about distance to the measurement object along a measurement axis defined by the common path and the first path.

Also, the interferometer may be configured to further direct at least another one of the sub-beams to contact the measurement object at least a second time along a second path different from the common path and different from the first path. For example, the interferometer maybe configured to derive another set of sub-beams from the input beam and combine each of the sub-beams that contacts the measurement object at least twice with a corresponding sub-beam from the other set to produce a corresponding one of the output beams.

The interferometer may also be configured to derive another set of sub-beams from the input beam, combine the sub-beam that contacts the measurement object at least twice with one of the sub-beams from the other set to produce one of the output beams, direct another one of the sub-beams from the other set to contact the measurement object along a second path different from the common path, and combine another one of the sub-beams that contact the measurement object along the common path with the sub-beam that contacts the measurement object along the second path to produce another one of the output beams.

In any of the embodiments in which the sub-beams are referred to, the interferometer may further be configured to: i) combine the first beam after it contacts the measurement object with a primary reference beam to define an intermediate beam; ii) separate the intermediate beam into a set of secondary measurement beams and a set of secondary reference beams; iii) direct each of the secondary measurement beams to contact the measurement object; and iv) recombine each secondary measurement beam after it contacts the measurement object with a one of corresponding secondary reference beams to produce a corresponding one of the output beams, wherein each of the sub-beams corresponds to a different one of the secondary measurement and reference beams.

The interferometer may include: a common polarizing beam-splitter positioned to direct a primary measurement beam derived from an incident input beam to contact the measurement object along the common path; and a return beam assembly configured to receive an intermediate beam including the primary measurement beam from the polarizing beam-splitter, separate the intermediate beam into multiple beams, and direct the multiple beams back to the polarizing beam-splitter. The polarizing beam-splitter may be further positioned to direct a primary reference beam derived from the incident input beam to contact a reflective reference object, wherein the primary measurement beam and primary reference beam correspond to orthogonal polarization components of the incident input beam. The polarizing beam-splitter may be further positioned to recombine the primary measurement and reference beams to form the intermediate beam after they contact the measurement and reference objects, respectively.

In addition, the polarizing beam-splitter may be is positioned to: i) separate the multiple beams into a set of secondary measurement beams and a set of secondary reference beams; ii) direct each of the secondary measurement beams to contact the measurement object; iii) direct each of the secondary reference beams to contact the reference object; and iv) recombine each secondary measurement beam with a corresponding one of the secondary reference beams after they contact the measurement and reference objects, respectively, to form a corresponding one of the output beams.

In such embodiments, each secondary measurement beam may contact the measurement object along a path different from the common the path. Furthermore, the interferometer may include the reference object. Alternatively, the reference object may correspond to another measurement object, such as in a differential plane mirror interferometer. In either case, the reference object may include a plane minor.

The interferometer may further includes a measurement quarter-wave retarder positioned between the polarizing beam-splitter and the measurement object and also a reference quarter-wave retarder positioned between the polarizing beam-splitter and the reference object.

The interferometer further may include an input beam optical assembly including a non-polarizing beam-splitter, wherein the input beam optical assembly is configured to separate a progenitor input beam into the first-mentioned input beam and a second input beam propagating parallel to the first input beam and direct the first and second input beams to the polarizing beam-splitter.

The return beam assembly may include at least one set of fold optics and at least one non-polarizing beam-splitter positioned to separate the intermediate beam into the multiple beams. For example, the set of fold optics may include a retroreflector positioned to receive the intermediate beam prior to any of the non-polarizing beam-splitters. The return beam assembly further may include a beam-splitting assembly including the at least one non-polarizing beam-splitter, wherein the beam-splitting assembly receives the intermediate beam from the retroreflector, generates the multiple beams, and directs the multiple beams back to the polarizing beam splitter along directions parallel to that of the intermediate beam. Moreover, the beam-splitting assembly may include multiple non-polarizing beam-splitters. Also, the return beam assembly further may include a retardation plate positioned between the retroreflector and the beam-splitting assembly, wherein the retardation plate is oriented to reduce polarization rotation of the intermediate beam caused by the retroreflector.

In other embodiments, the set of fold optics may include angle-measuring fold optics and distance-measuring fold optics, wherein the angle-measuring fold optics includes a half-wave retarder positioned to rotate the polarization of at least one of the multiple beams. The angle-measuring fold optics may further include a penta-prism and the distance-measuring optics may include a retroreflector. The non-polarizing beam-splitter may be positioned to receive the intermediate beam before or after any of the fold optics.

In general, in another aspect, the invention features a method including interferometrically producing multiple output beams each including information about a relative position of a measurement object with respect to a different degree of freedom. Each output beam includes a beam component that contacts the measurement object at least one time along a common path. Furthermore, at least one of the beam components further contacts the measurement object at least a second time along a first path different from the common path.

Embodiments of the method may further include any of the features corresponding to those described above for the apparatus.

In general, in another aspect, the invention features an apparatus including a multi-axis interferometer for measuring a relative position of a reflective measurement object along multiple degrees of freedom, wherein the interferometer is configured to produce multiple output beams each including information about the relative position of the measurement object with respect to a different one of the degrees of freedom. Each output beam includes a beam component that contacts the measurement object at least one time along a common path. At least one of the output beams includes another beam component different from the first-mentioned beam component. The other beam component contacts the measurement object at least one time along a first path different from the common path.

Embodiments of the second-mentioned apparatus may include any of the following features.

The output beam including the first beam component that contacts the measurement object along the common path and the other beam component that contacts the measurement object along the first path may include information about the angular orientation of the measurement object with respect to a first rotation axis. For example, the first rotation axis may be normal to a plane defined by the common path and the first path. Furthermore, a second one of the output beams may include information about an angular orientation of the measurement object with respect to a second rotation axis different from the first rotation axis, wherein the second output beam includes the first-mentioned beam component that contacts the measurement object along the common path and another beam component different from the first beam component, wherein the other beam component in the second output beam contacts the measurement object along a second path different from the common path. For example, the second rotation axis may be normal to the first rotation axis.

Further embodiments of the second-mentioned apparatus may include any of the additional features described above for the first-mentioned apparatus.

In general, in another aspect, the invention features a method including interferometrically producing multiple output beams each including information about a relative position of a measurement object with respect to a different degree of freedom, wherein each output beam includes a beam component that contacts the measurement object at least one time along a common path. At least one of the output beams includes another beam component different from the first-mentioned beam component. The other beam component contacts the measurement object at least one time along a first path different from the common path.

Embodiments of the second-mentioned method may further include any of the features corresponding to those described above for the first-mentioned and second-mentioned apparatus.

In another aspect, the invention features a lithography system for use in fabricating integrated circuits on a wafer. The lithography system includes: a stage for supporting the wafer; an illumination system for imaging spatially patterned radiation onto the wafer; a positioning system for adjusting the position of the stage relative to the imaged radiation; and any of the interferometric apparatus described above for monitoring the position of the wafer relative to the imaged radiation.

In another aspect, the invention features another lithography system for use in fabricating integrated circuits on a wafer. This lithography system includes: a stage for supporting the wafer; and an illumination system including a radiation source, a mask, a positioning system, a lens assembly, and any of the interferometric apparatus described above. During operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

In another aspect, the invention features a beam writing system for use in fabricating a lithography mask. The beam writing system includes: a source providing a write beam to pattern a substrate; a stage supporting the substrate; a beam directing assembly for delivering the write beam to the substrate; a positioning system for positioning the stage and beam directing assembly relative one another; and any of the interferometric apparatus described above for monitoring the position of the stage relative to the beam directing assembly.

In another aspect, the invention features a lithography method for use in fabricating integrated circuits on a wafer. The lithography method includes: supporting the wafer on a moveable stage; imaging spatially patterned radiation onto the wafer; adjusting the position of the stage; and monitoring the position of the stage using any of the interferometric methods described above.

In another aspect, the invention features another lithography method for use in the fabrication of integrated circuits. This lithography method includes: directing input radiation through a mask to produce spatially patterned radiation; positioning the mask relative to the input radiation; monitoring the position of the mask relative to the input radiation using any of the interferometry methods described above; and imaging the spatially patterned radiation onto a wafer.

In another aspect, the invention features a third lithography method for fabricating integrated circuits on a wafer including: positioning a first component of a lithography system relative to a second component of a lithography system to expose the wafer to spatially patterned radiation; and monitoring the position of the first component relative to the second component using any of the interferometric methods described above.

In another aspect, the invention features a method for fabricating integrated circuits, the method including any of the lithography methods described above.

In another aspect, the invention features a method for fabricating integrated circuits, the method including using any of the lithography systems described above.

In another aspect, the invention features a method for fabricating a lithography mask, the method including: directing a write beam to a substrate to pattern the substrate; positioning the substrate relative to the write beam; and monitoring the position of the substrate relative to the write beam using any of the interferometry methods described above.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 10 is a perspective view of a variant of the second embodiment shown in FIG. 3a.

FIG. 13a is a plan view of a first plane of the interferometric system;

FIG. 13b is a plan view of a second plane of the interferometric system; FIG. 13c is a side-view of the interferometric system.

FIG. 15a is a plan view of a first plane of the interferometric system; FIG. 15b is a side-view of the interferometric system; FIG. 15c is another side view of the interferometric system.

Like reference numerals in different figures refer to like elements.

DETAILED DESCRIPTION

Figure 1:
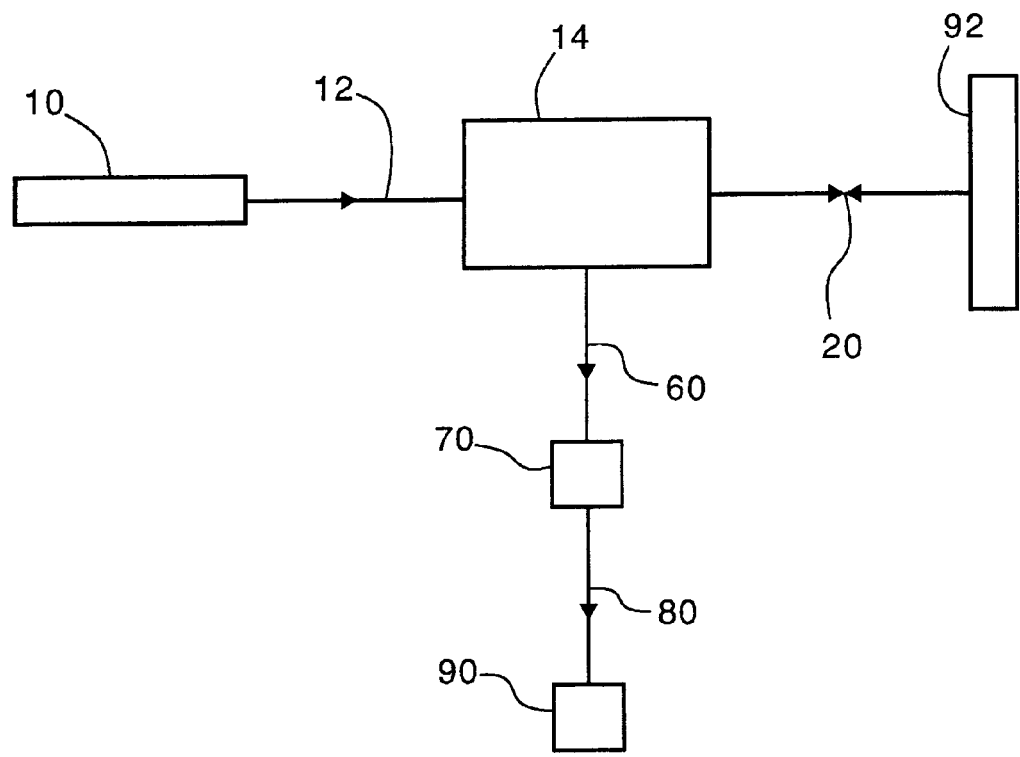
FIG. 1 is a schematic diagram of an interferometry system.

FIG. 1 is a diagrammatic view of an interferometer system by which linear and angular displacements of a plane mirror measurement object 92 are measured and monitored. As shown in FIG. 1, the interferometer system comprises source 10, interferometer 14 which may be structured and arranged as one of a number of interferometer types, detector 70, and electronic processor and computer 90 programmed in a well-known manner to perform data processing. With each type, as will be described in more detail hereinafter as separate embodiments, interferometer beams travel to and from mirror 92 generally along an optical path designated as 20 and output beams travel from interferometer 14 to detector 70 along optical path designated as 60. The output beams are detected by detector 70 to generate electrical interference signals that are transmitted to electronic processor and computer 90 as signal 80. Typically, a polarizer or polarization "analyzer" (not shown) is used to mix the polarizations of the measurement and reference beam components of the output beam prior to its detection by detector 70. Also in some embodiments, a fiber-optic pick-up (not shown) is used to couple the polarization-mixed output beam to a remote detector.

Input beam 12 is furnished by source 10 and is a two-component beam. The two components have different frequencies and are orthogonally plane polarized. The different frequencies can be produced in source 10, for example, by laser Zeeman splitting, by acousto-optical modulation, or internal to the laser using birefringent elements or the like.

Figure 2A:
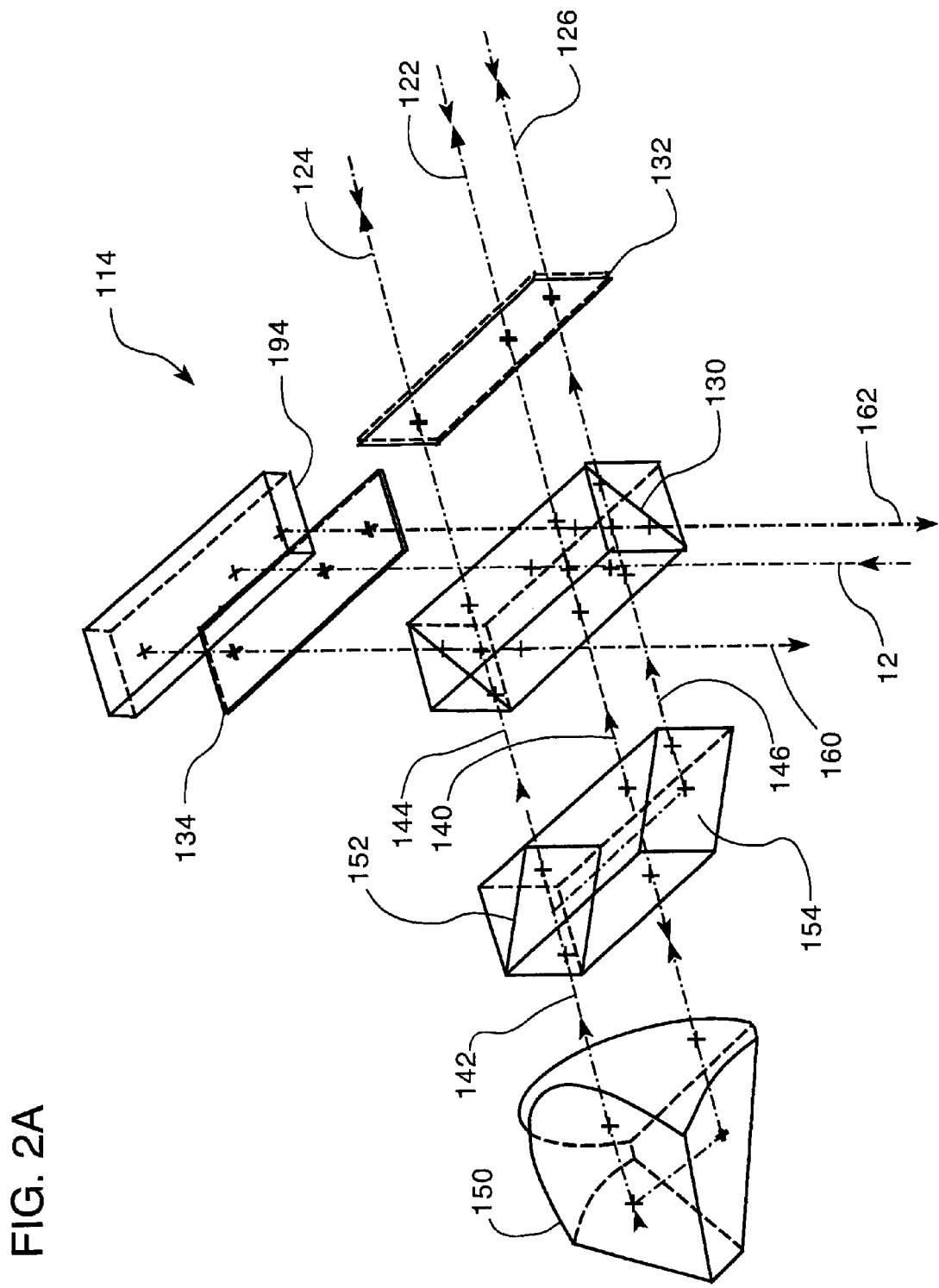
FIG. 2a is a perspective view of a first embodiment of a multi-axis interferometer.

The first embodiment of interferometer 14 is shown in a perspective view in FIG. 2a and comprises two plane mirror interferometers in an integral optical assembly generally shown as numeral 114. Interferometer 114 will be described for operation as interferometer 14. The paths of measurement beams 122, 124, and 126 correspond to the path indicated by numeral 20 in FIG. 1. The two plane mirror interferometers have a common measurement beam path for one pass to plane mirror measurement object 92. The common measurement beam path corresponds to the path of measurement beam 122.

Beam 12 is incident on polarizing beam-splitter interface 130 and exits beam-splitter 130 as beam 140 comprising reference and measurement beam components. The planes of polarization of the two components of input beam 12 are parallel and orthogonal to the plane incidence of beam 12 at beam-splitter interface 130. The measurement beam component of beam 140 has been reflected by beam-splitter 130 and plane mirror 92, transmitted by beam-splitter 130, and transmitted twice by quarter-wave phase retardation plate 132. The double pass through phase retardation plate 132 rotates the plane of polarization of the measurement beam by 90 degrees. The reference beam component of beam 140 has been transmitted by beam-splitter 130, reflected by plane mirror 194 and beam-splitter 130, and transmitted twice by quarter-wave phase retardation plate 134. The double pass through phase retardation plate 134 rotates the plane of polarization of the reference beam by 90 degrees.

First and second portions of beam 140 are used as beams for the two plane mirror interferometers, respectively, wherein the first and second portions have measurement beam components that have a common measurement beam path for one pass to the plane mirror measurement object 92. Beam 140 is transmitted by prism 154 and reflected by retroreflector 150 as beam 142. A first portion of beam 142 corresponding to the first portion of beam 140 is transmitted by non-polarizing beam-splitter interface 152 as beam 144 and a second portion of beam 142 corresponding to the second portion of beam 140 is reflected by beam-splitter interface 152 and prism 154 as beam 146.

Beam 144 is incident on beam-splitter interface 130 and exits beam-splitter interface 130 as output beam 160 comprising reference and measurement beam components. The measurement beam component of beam 144 is transmitted by beam-splitter interface 130, reflected by plane mirror 92 and beam-splitter interface 130, and transmitted twice by quarter-wave phase retardation plate 132. The reference beam component of beam 144 is reflected by beam-splitter interface 130 and plane mirror 194, transmitted by beam-splitter interface 130, and transmitted twice by quarter wave phase retardation plate 134.

Beam 146 is incident on beam-splitter interface 130 and exits beam-splitter interface 130 as output beam 162 comprising reference and measurement beam components. The measurement beam component of beam 146 is transmitted by beam-splitter interface 130, reflected by plane mirror 92 and beam-splitter interface 130, and transmitted twice by quarter-wave phase retardation plate 132. The reference beam component of beam 146 is reflected by beam-splitter interface 130 and plane mirror 94, transmitted by beam-splitter interface 130, and transmitted twice by quarter wave phase retardation plate 134.

Output beams 160 and 162 are detected by detector 70 to generate signal 80 comprising two electrical interference signals. Detector 70 comprises polarizers to mix the reference and measurement beam components of output beams 160 and 162. Electrical interference signals of signal 80 are transmitted to electronic processor and computer 90 and processed for information about the displacement of mirror 92 along interferometer measurement axes $x_1$ and $x_{10}$, respectively. The average of the changes in displacements $x_1$ and $x_{10}$ is computed by electronic processor and computer 90 as the change in linear displacement of mirror 92 and the chance in the difference $(x_{10}-x_1)$ is used by electronic processor and computer 90 to compute the change in angular displacement of mirror 92 as $\text{atan}[(x_{10}-x_1)/b_1]$ wherein $b_1$ is the spatial separation of the measurement axes of the two interferometers (see FIG. 2b). The measured change in angular orientation is in the plane of two measurement axes.

Figure 2B:
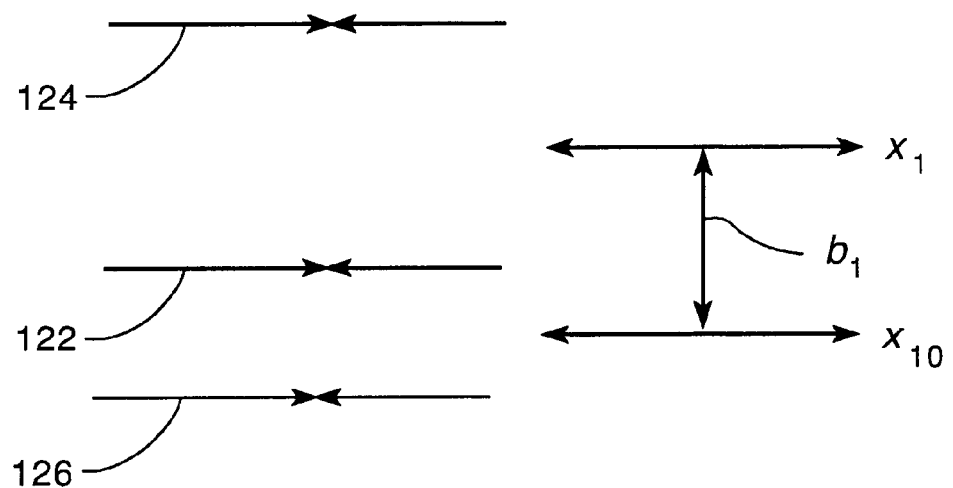
FIG. 2b shows the relative locations of the measurement beams in the first embodiment.

The relative locations of measurement beams 122, 124, and 126 are shown in FIG. 2b. Also shown in FIG. 2b are the relative locations of the measurement axes $x_1$ and $x_{10}$ and the measurement axis separation $b_1$.

The location of retroreflector 150 affects the location of beam 144 relative to beam 140 but does not affect the spatial separation of beams 144 and 146. The spatial separation of beams 144 and 146 is determined by properties of the rhomb formed by beam-splitter interface 152 and the reflecting surface of prism 154 and corresponds to the separation $b_1$ of axes $x_{10}$ and $x_1$. A corresponding feature is that the placement of the rhomb does not affect the spacing between measurement axes $x_{10}$ and $x_1$.

Retroreflector 150 is shown in FIG. 1 as a solid cube corner retroreflector. For a cube corner retroreflector, the maximum diameter of a beam or maximum clear circular aperture that can be used such that no part of the beam crosses a sector boundary of the cube corner is ½ of the separation of the input and output beams of the cube corner retroreflector. However, the maximum clear aperture of other optical elements, e.g., beam-splitter interface 152, prism 154 and beam-splitter interface 130, can be equal to the separation of the input and output beams of the cube corner. This factor of ½ represents a loss of a factor of 2 in the maximum diameter that can be used in an interferometer system that is configured with traditional high stability plane mirror interferometers, HSPMIs. In comparison, interferometer 114 of the first embodiment can be structured such that the first embodiment does not have this loss factor when using cube corner retroreflectors.

The location of beam 140 relative to beams 144 and 146 does not affect the spatial separation $b_1$ of axes $x_{10}$ and $x_1$. As a consequence, the size of cube corner retroreflector 150 can be chosen so as to not be the optical element that sets the diameter of the clear aperture of the interferometer without altering separation $b_1$.

Retroreflector 150 is shown in FIG. 2a as a solid cube corner retroreflector. Cube corner retroreflector 150 may have its reflecting surfaces coated so as to reduce generation of cyclic errors in electrical interference signals of signal 80 such as described in commonly owned U.S. Provisional Patent Application Serial No. 60/371,868 filed Apr. 11, 2002 and entitled "Retroreflector Coating For Heterodyne Interferometer" by Henry A. Hill (Z410), the contents of which are incorporated herein by reference. Retroreflector 150 may alternatively comprise a polarization preserving retroreflector to reduce generation of cyclic errors such as described in commonly owned U.S. patent application Ser. No. 6,198, 574 B1 entitled "Polarization Preserving Optical System" by Henry A. Hill without departing from the scope and spirit of the present invention. The contents of the cited U.S. patent are incorporated herein by reference. Also the polarization preserving retroreflector does not reduce the effective clear aperture of an interferometer system such as a cube corner retroreflector.

An advantage of the first embodiment is that only one retroreflector is used for two double pass interferometers that measure two degrees of freedom of a measurement object. This feature contributes to a more robust compact and lower cost integral optical assembly.

Another advantage of the first embodiment is that the optical paths in retroreflector 150 for beams of the two double pass interferometers are the same. This feature reduces the differences in optical paths in the two interferometers of the first embodiment that would otherwise arise in a corresponding interferometer system comprising two traditional HSPMIs with two separate retroreflectors. The differences in optical paths can arise as a result of non-homogeneities in glass and temperature gradients in the interferometer. Also for an interferometer system comprising two plane mirror interferometers, e.g., traditional HSPMIs, with two separate retroreflectors, the use of two separate retroreflectors introduces in general a non-cyclic error. A relative misalignment between the second pass measurement beams of the two double pass interferometers due to manufacturing errors in the retroreflectors generates non-cyclic errors in the form of differing cosine or cosecant correction factors in converting changes in interferometric phase measurements to changes in linear displacements.

Another advantage of the first embodiment that is the result of the optical paths in retroreflector 150 for beams of the two double pass interferometers being the same is that the corresponding portions of non-cyclic errors arising from wave front errors in the presence of beam shears due to changes in orientation of a plane mirror measurement object are common to both electrical interference signals and cancel out in computing changes in angular displacements from changes in two linear displacements. The wave front errors may be for example the result of birefringence in optical elements and the shapes of optical surfaces by which beams are reflected or transmitted.

Another advantage of the first embodiment is that the placement of retroreflector 150 does not affect the spacing between the measurement axes of the two double pass interferometers. Thus the spacing is not determined by the placement of retroreflectors during assembly of an integral optical assembly but by the manufacturing of a single optical element.

Another advantage of the first embodiment is that the placement of the rhomb formed by the polarizing interface of beam-splitter interface 152 and the reflecting surface prism 154 does not affect the spacing between the measurement axes of the two double pass interferometers. Thus the spacing is not determined by the placement of rhomb during assembly of an integral optical assembly but by the manufacturing of a single optical element, i.e. the rhomb.

Another advantage of the first embodiment is that the placement of the rhomb formed by the polarizing interface of beam-splitter interface 152 and the reflecting surface prism 154 does not affect the amplitude of electrical interference signals of the two double pass interferometers.

Another advantage of the first embodiment is that for a given maximum spacing $2b_1$ of the measurement beams at the measurement object mirror, larger clear apertures can be accommodated relative to that possible with two plane mirror interferometers such as traditional HSPMIs that use cube corner retroreflectors wherein beams do not cross sector boundaries of retroreflectors.

Another advantage of the first embodiment is that the angular displacement obtained from the difference in displacements of the two double pass interferometers have a reduced sensitivity to temperature gradients.

In the first embodiment, measurement beam 122 can be thought of as a "first" beam or "primary" measurement beam that makes a first pass to the plane mirror measurement object and is subsequently separated into multiple "sub-beams" by polarizing beam splitter interface 130 and a "return beam assembly" that includes retroreflector 150, beam-splitting interface 152, and mirror 154. In the first embodiment these sub-beams corresponding to measurement beams 124 and 126 and can further be considered "secondary" measurement beams in that they make a second pass to the plane mirror measurement object along a path different from that corresponding to measurement beam 122. Thus, in the first embodiment, each sub-beam corresponds to a component in one of the output beams that contacts the measurement object once along a common path defined by measurement beam 122 (when part of measurement beam 122) and then contacts the measurement object a second time along another path different from the common path. Moreover, the reference portion of input beam 12 reflected by the polarizing beam splitter interface 130 towards reference plane mirror 194 can be thought of as a "primary" reference beam, which makes a first pass to the reference plane mirror and is subsequently recombined with measurement beam 122 (after it makes its first pass to the plane mirror measurement object) to define an "intermediate" beam, which is subsequently separated into "multiple" beams by the return beam assembly, the multiple beams corresponding to beams 144 and 146. The polarizing beam-splitting interface 130 then separates the multiple beams into the set of secondary measurement beams 20 (corresponding to measurement beams 124 and 126) and a set of secondary reference beams (corresponding to the reference beams that make the second pass to plane mirror reference object 194). A similar nomenclature may be applied to each of the following embodiments.

Figure 3A:
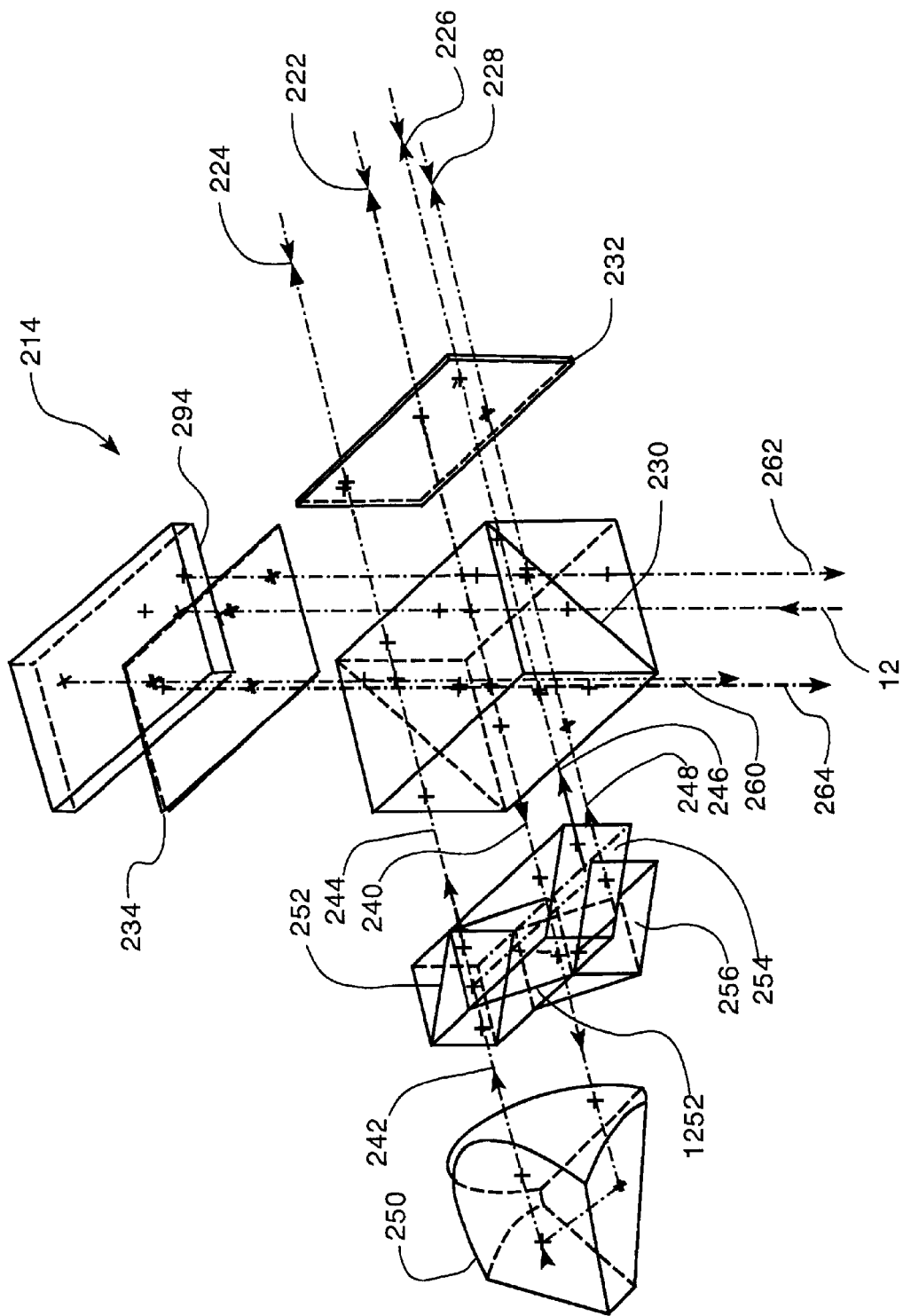
FIG. 3a is a perspective view of a second embodiment of a multi-axis interferometer.

A second embodiment of interferometer 14 is shown in a perspective view in FIG. 3a and comprises three plane mirror interferometers in an integral optical assembly generally shown as numeral 214. Interferometer 214 will be described for operation as interferometer 14 and is structured to measure and monitor changes in the linear displacement in one direction and the changes in angular orientation in two orthogonal planes of mirror 92. The paths of measurement beams 222, 224, 226, and 228 correspond to the path indicated by numeral 20 in FIG. 1. The three plane mirror interferometers have a common measurement beam path for one pass to plane mirror measurement object 92. The common measurement beam path corresponds to the path of measurement beam 222.

Many elements of the second embodiment perform the same functions as elements of the first embodiment. The elements of the first and second embodiments performing the same functions are indicated by numerals that differ by 100.

Beam 12 is incident on polarizing beam-splitter interface 230 and exits beam-splitter interface 230 as beam 240 comprising reference and measurement beam components. The planes of polarization of the two components of input beam 12 are parallel and orthogonal to the plane incidence of beam 12 at beam-splitter interface 230. Three portions of beam 240 are used as beams for the three plane mirror interferometers, respectively, wherein the three portions have measurement beam components that have a common measurement beam path for one pass to the plane mirror measurement object 92. The remaining description of beam 240 is the same as the corresponding portion of the description given for beam 140 of the first embodiment.

A first portion of the three portions of beam 240 is sequentially transmitted by prism 254, retroreflector 250, and beam-splitter interface 252 as beam 244. A second portion of the three portions corresponds to a first portion of a second portion of beam 240 reflected by beam-splitter interface 252 and is transmitted by beam-splitter interface 1252 as beam 246 after reflection by prism 254. A third portion of the three portions corresponds to a second portion of the second portion of beam 240 reflected by beam-splitter interface 252 and is reflected by beam-splitter interface 1252 as beam 248 after reflection by prism 256.

Beam 244 is incident on beam-splitter interface 230 and exits beam-splitter interface 230 as output beam 260 comprising reference and measurement beam components. The remaining description of output beam 260 is the same as the corresponding portion of the description given for output beam 160 of the first embodiment. Beam 246 is incident on beam-splitter interface 230 and exits beam-splitter interface 230 as output beam 262 comprising reference and measurement beam components. The remaining description of output beam 262 is the same as the corresponding portion of the description given for output beam 162 of the first embodiment. Beam 248 is incident on beam-splitter interface 230 and exits beam-splitter interface 230 as output beam 264 comprising reference and measurement beam components. The description of propagation of the measurement and reference beam components of beam 248 through optical elements to form beam 264 is the same as the corresponding portion of the description given for the propagation of beam 144 to form beam 160 of the first embodiment.

Measurement beams 224, 226, and 228 that propagate along path 20 are associated by output beams 260, 262, and 264, respectively. Measurement beams 222 and 224 are associated with measurement axis $x_2$, measurement beams 222 and 226 are associated with measurement axis $x_{20}$, and measurement beams 222 and 228 are associated with measurement axis $x_{200}$ (see FIG. 3$b$). The spatial separation of $x_{20}$ and $x_2$ is $b_2$ and the spatial separation of $x_{200}$ and the plane of $x_{20}$ and $x_2$ is $b_{20}$.

Figure 3B:
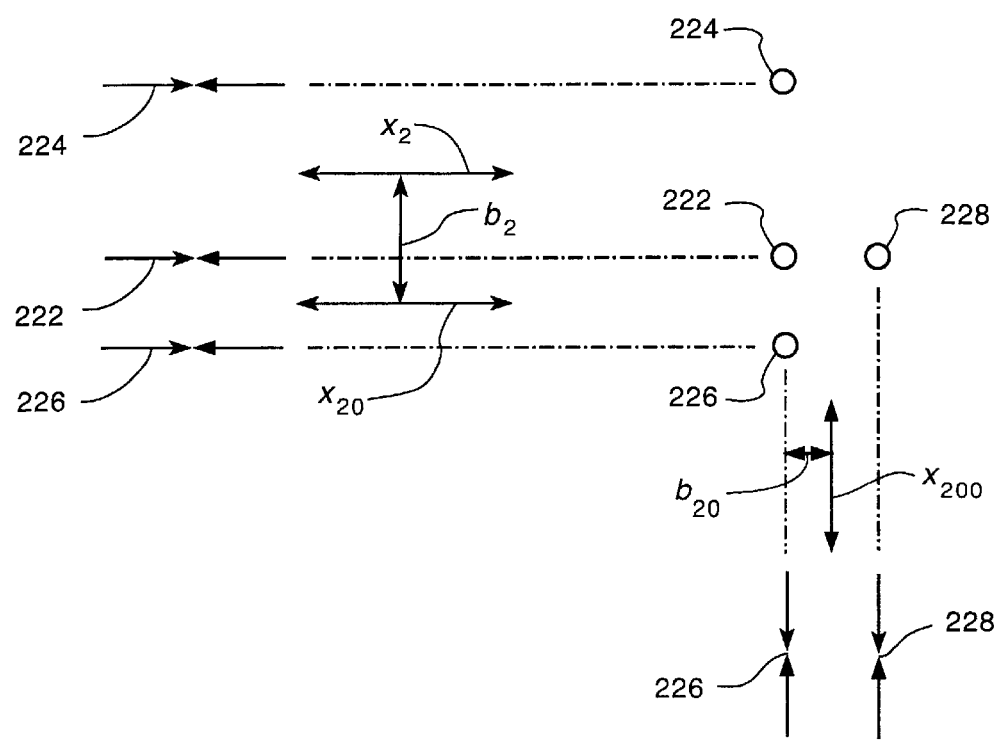
FIG. 3b shows the relative locations of the measurement beams in the second embodiment.

The relative locations of measurement beams 222, 224, 226, and 228 are shown in FIG. 3$b$. Also shown in FIG. 3$b$ are the relative locations of the measurement axes $x_2$, $x_{20}$, and $x_{200}$ and the measurement axis separations $b_2$ and $b_{20}$.

The changes in three degrees of freedom of mirror 92 are computed by electronic processor and computer 90 using the three measured linear displacements and measured properties of $b_2$ and $b_{20}$.

The features and advantages of the second embodiment such as with respect to a compact robust integral optical assembly, lower cost, the clear apertures, placement of retroreflector 250, determination of separations $b_2$ and $b_{20}$, and reduced non-cyclic error effects are the same as corresponding features and advantages described for the first embodiment of the present invention.

Figure 10:
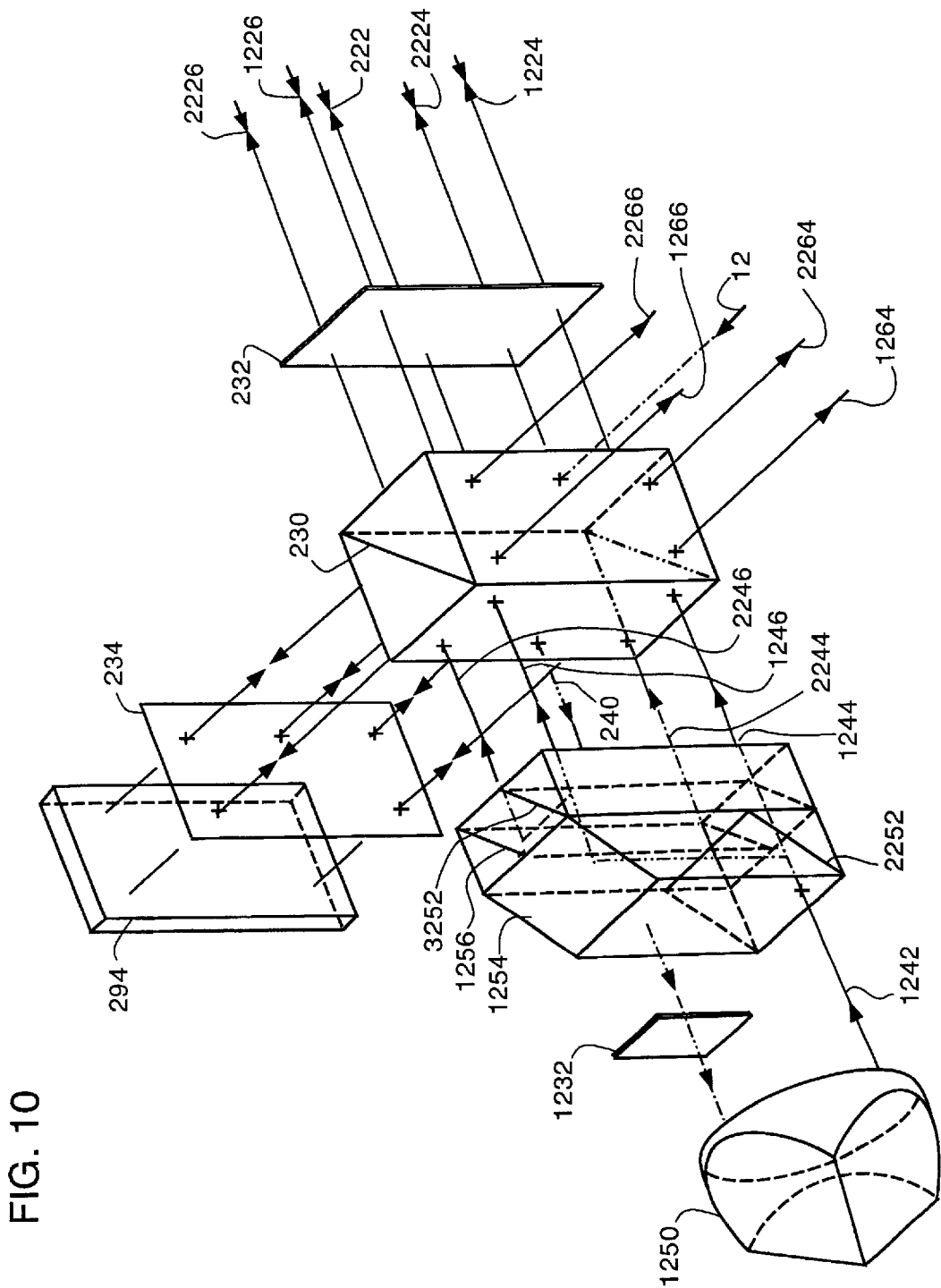

A variant of the second embodiment is shown in FIG. 10. The variant of the second embodiment is a 4-axis plane mirror interferometer that has, for the same size polarizing beam-splitter comprising interface 230, larger measurement beam clear apertures relative to the measurement beam clear apertures of the second embodiment shown in FIG. 3$a$. Clear apertures are defined herein by boundaries of optical surfaces such as sector boundaries of cube corner retroreflector 1250.

The variant of the second embodiment generally exhibits as a result of the larger measurement beam clear apertures reduced non-cyclic non-linear errors generated by wavefront errors and beam shear.

Alternatively for a given magnitude of non-cyclic non-linear errors generated by wavefront errors and beam shear, the size of the interferometer in the variant of the second embodiment may be reduced relative to the size of a corresponding interferometer in the second embodiment.

An Abbe offset error encountered in an end use application of the variant of the second embodiment may be decreased relative to a corresponding Abbe offset error encountered for the same end use application of the second embodiment.

The optical angular resolution for the variant of the second embodiment may be increased in one plane relative to the optical angular resolution in the same plane for the same end use application of the second embodiment.

Elements of the variant of the second embodiment and elements of the second embodiment that have the same element numbers perform like functions. Referring to FIG. 10, two sections of interface 1256 are coated to serve as reflecting interfaces for beams that are reflected as beams 2244 and 2246. A center section of interface 1256 is uncoated so as to transmit beam 240 wherein the transmitted beam is subsequently transmitted by phase retardation plate 1232 and cube corner retroreflector 1250 as beam 1242. Beam 1242 is incident on beam-splitter interface 2252 and a first portion thereof transmitted and a second portion thereof reflected. The transmitted first portion is incident on beam-splitter interface 3252 and a first portion thereof transmitted as beam 1244 and a second portion thereof reflected to form beam 2244 after reflection by a reflecting section of interface 1256. A portion of the reflected second portion from beam interface 2252 is transmitted by beam-splitter interface 3252 to form beam 1246 after reflection by a reflecting interface 1254 and another portion of the reflected second portion from beam interface 2252 is reflected by beam-splitter interface 3252 to form beam 2246 after reflection by interface 1254 and a reflecting section of interface 1256.

Beam 1244 is incident on beam-splitter interface 230 and exits beam-splitter interface 230 as output beam 264 comprising reference and measurement beam components. The remaining description of output beam 1264 is the same as the corresponding portion of the description given for output beam 260 of the second embodiment. Beam 1246 is incident on beam-splitter interface 230 and exits beam-splitter interface 230 as output beam 1266 comprising reference and measurement beam components. The remaining description of output beam 1266 is the same as the corresponding portion of the description given for output beam 260 of the second embodiment. Beam 2244 is incident on beam-splitter interface 230 and exits beam-splitter interface 230 as output beam 2264 comprising reference and measurement beam components. The description of propagation of the measurement and reference beam components of beam 2244 through optical elements to form beam 2264 is the same as the corresponding portion of the description given for the propagation of beam 244 to form beam 260 of the second embodiment. Beam 2246 is incident on beam-splitter interface 230 and exits beam-splitter interface 230 as output beam 2266 comprising reference and measurement beam components. The description of propagation of the measurement and reference beam components of beam 2246 through optical elements to form beam 2266 is the same as the corresponding portion of the description given for the propagation of beam 246 to form beam 262 of the second embodiment.

Measurement beam 222 is a classified as primary measurement beam since portions of beam 222 serve as the first pass measurement beams to the measurement object 92 for each of four measurement axes. Measurement beams 1224, 2224, 1226, and 2226 that propagate along path 20 are associated with output beams 1264, 2264, 1266, and 2266, respectively.

As shown in FIG. 10, the plane defined by output beam 1242 and corresponding input beam from and to cube corner retroreflector 1250, respectively, is at an angle of approximately 45 degrees with respect to the planes defined by the polarization states of the measurement and reference beam components of beam 240. As a consequence, the planes of the polarization states of reference and measurement beam components of the input beam to cube corner retroreflector 1250 are not aligned with the nominal fast and slow axes of cube corner retroreflector 1250. To compensate for the effects of the relative rotation of the planes of polarization states of reference and measurement beam components of the input beam to cube corner retroreflector 1250 and the nominal fast and slow axes of cube corner retroreflector 1250, a phase retardation plate 1232 is placed in the path of the input beam to cube corner retroreflector 1250 with the fast axis of phase retardation plate 1232 either parallel or orthogonal to the fast axis of cube corner retroreflector 1250.

The difference in phase shift introduced by phase retardation plate 1232 is selected to compensate for the phase retardation introduced by cube corner retroreflector 1250 so as to reduce generation of cyclic errors and reduce loss in amplitude in electrical interference signals of signal 80.

Phase retardation plate 1232 may alternatively be placed in the path of output beam 1242 from cube corner retroreflector 1250. The compensation for the phase retardation properties may alternatively be achieved by placing a phase retardation plate in the paths of both the input and output beams of cube corner retroreflector 1250.

The properties of phase retardation plate 1232 will be determined as noted by the phase retardation properties of cube corner retroreflector 1250. For a cube corner retroreflector coated with silver, common in commercial interferometers, the fast and slow axes of the silver coated cube corner retroreflector are rotated by approximately 3 degrees with respect to the plane defined by the direction of input and output beams to the silver coated cube corner retroreflector. In addition, a phase shift is introduced that is approximately 180 degrees (the magnitude of the sine of the phase shift is ≅0.1) such that the cube corner retroreflector behaves approximately as a half wave phase retardation plate. The phase shift introduced by phase retardation plate 1232 is selected to compensate for the phase shift property of cube corner retroreflector 1250 in order to reduce the cyclic errors that would otherwise be introduced.

Other coatings may be placed on cube corner retroreflector 1250 such as described in cited commonly owned U.S. Provisional Patent Application No. 60/371,868, filed Apr. 11, 2002 and entitled "Retroreflector Coating For Heterodyne Interferometer" by Henry A. Hill, the contents of which is incorporated herein by reference. With a coating described in cited provisional application, the coated cube corner retroreflector 1250 has to a high precision the properties of a half wave phase retardation plate with respect to the relationship of the polarization states of input and output beam is. The phase retardation properties are compensated in this case with a standard half wave phase retardation plate used as phase retardation plate 1232.

An advantage of the variant of the second embodiment is that the effective clear apertures for measurement beams in the variant of the second embodiment has been increased relative to the effective clear apertures for the measurement beams of the second embodiment. The increase is in part the consequence of the shift of primary measurement beam 222 to a central location halfway between measurement beams 2224 and 2226. As a consequence of the shift, the effective clear apertures for beams 2224 and 2226 can be made equal which represents an increase in effective clear apertures relative to the effective clear apertures for beams of the second embodiment wherein the effective clear aperture is defined by beam 226.

The increase in effective clear apertures of the variant of the second embodiment is also a consequence in part of the rotation of the fast and slow axes of cube corner retroreflector 1250 by approximately 45 degrees with respect to planes of polarization of reference and measurement beam components of beam 240. For such a rotation of fast and slow axes, there is a corresponding rotation of the sector boundaries of cube corner retroreflector 1250 to be within approximately 15 degrees of two orthogonal independent degrees of freedom of the measurement beams as compared to 30 and 60 degrees present in a traditional high stability plane mirror interferometer. Thus there is an approximate 15 degree relative alignment of the sector boundaries of cube corner retroreflector 1250 with respect to the approximate rectangular space spanned by the beam shears of the measurement beam component of beam 240 and a corresponding increase in effective clear aperture.

The shift of the primary measurement beam 222 to a central location halfway between measurement beams 2224 and 2226 is achieved without decreasing the clear aperture in the cube corner retroreflector 1250 by having output beam 1242 displaced both vertically and horizontally from the input beam to cube corner retroreflector 1250.

The larger measurement beam clear apertures generally will form the basis for another advantage of the variant of the second embodiment. For a given beam shear amplitude and surface figure specification of optical surfaces, the larger clear apertures will generally result in a decrease in corresponding non-cyclic non-linear errors.

It is also possible to decrease an Abbe offset of the variant of the second embodiment to a surface located away from beam 222 toward reference object 294 by displacing the primary beam 222 closer to the corresponding edge of polarizing beam-splitter having interface 230. It is possible to make the displacement closer to the corresponding edge without reducing the effective clear apertures of the variant of the second embodiment since the beam shear experienced by primary beam 222 is one half of the beam shear experienced by measurement beams 1224, 2224, 1226, and 2226 wherein the beam shears are a consequence of a change in orientation of measurement object 92. This feature of the variant of the second embodiment represents another advantage.

Another advantage of the variant of the second embodiment is the angular displacement resolution in a plane defined by beams 1226 and 2226 can be increased by the displacement of primary beam 222 closer to the corresponding edge of polarizing beam-splitter having interface 230.

The remaining description of the variant of the second embodiment is the same as the corresponding portions of the description given for the second embodiment.

It will be evident to those skilled in the art that the location of measurement beam 1226 may be shifted for example toward beam 1224 to a position halfway between the positions of beams 1226 and 1224 shown in FIG. 10 and in line with input beam 12 without departing from the scope and spirit of the present invention by shifting the location of reflecting surface 1254.

Figure 4A:
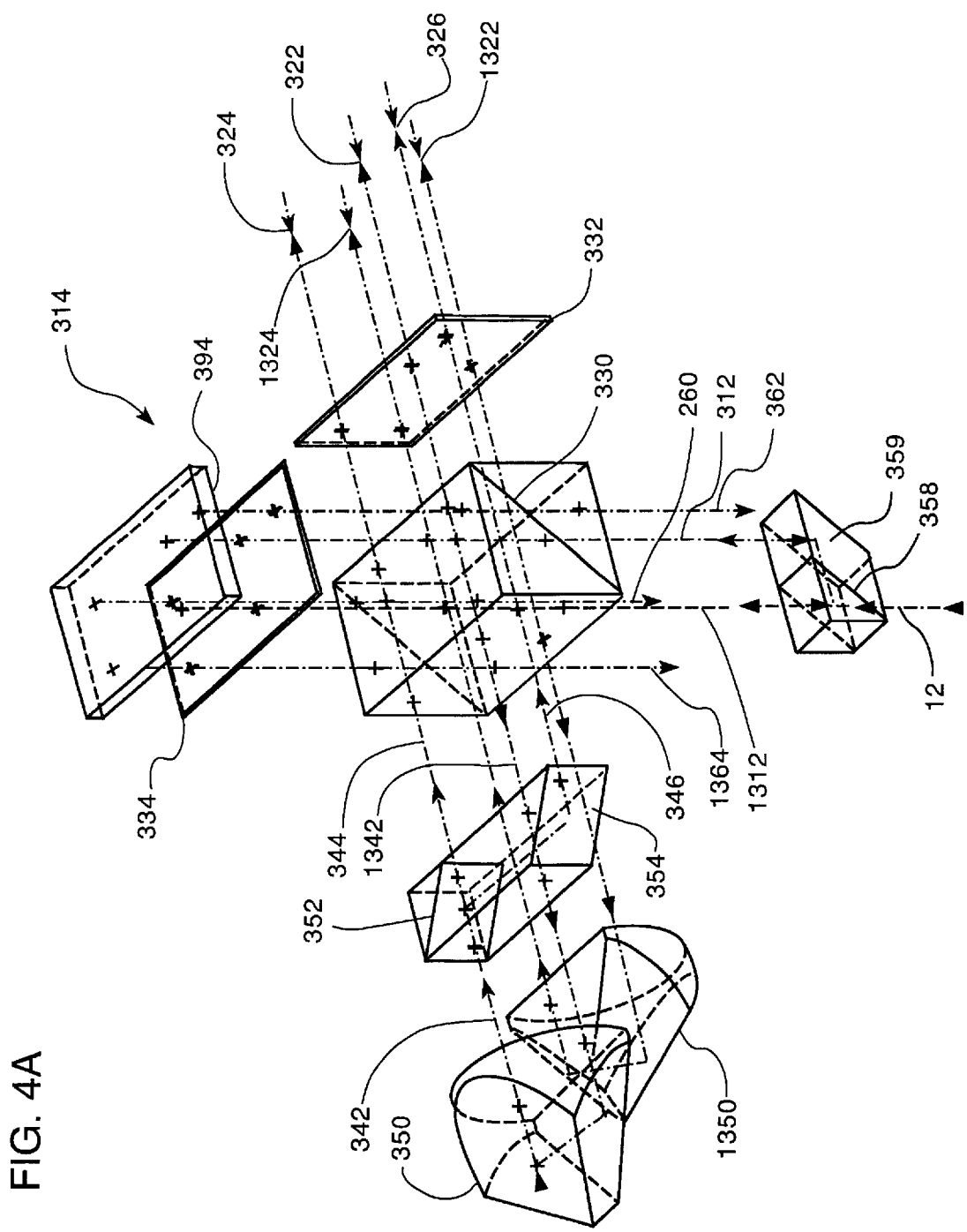
FIG. 4a is a perspective view of a third embodiment of a multi-axis interferometer.

A third embodiment of interferometer 14 is shown in a perspective view in FIG. 4a and comprises three plane mirror interferometers in an integral optical assembly generally shown as numeral 314. Interferometer 314 will be described for operation as interferometer 14 and is structured to measure and monitor changes in the linear displacement in one direction and the changes in angular orientation in two orthogonal planes of mirror 92. The paths of measurement beams 322, 324, 326, 1322, and 1324 correspond to the path indicated by numeral 20 in FIG. 1. Two of the three plane mirror interferometers have a common measurement beam path for one pass to plane mirror measurement object 92. The common measurement beam path corresponds to the path of measurement beam 322.

Many elements of the third embodiment perform the same functions as elements of the second embodiment. The elements of the second and third embodiments performing the same functions are indicated by numerals that differ by 100.

Beam 12 is incident on beam-splitter interface 358 and a first portion thereof is reflected as an input beam 312 after reflection by prism 359. A second portion of beam 12 is transmitted by beam-splitter interface 358 as an input beam 1312. Input beam 312 is incident on polarizing beam-splitter interface 330 and exits interferometer 314 as output beams 360 and 362. The measurement beams associated with output beams 360 and 362 are 322, 324, and 326. Input beam 1312 is incident on beam-splitter interface 330 and exits interferometer 314 as output beam 1364. The measurement beams associated with output beam 1364 are 1322 and 1324.

The description of the propagation of input beam 312 through interferometer 314 to form measurement beams 322, 324, and 326 and output beams 360 and 362 is the same as the corresponding description given for the description of the propagation of input beam 12 through interferometer 114 to form measurement beams 122, 124, and 126 and output beams 160 and 162 of the first embodiment.

The interferometer comprising retroreflector 1350 and polarizing beam-splitter interface 330 with measurement beams 1322 and 1324 and output beam 1364 is a traditional HSPMI. Accordingly, the description of the propagation of input beam 1312 through interferometer 314 to form measurement beams 1322 and 1324 and output beam 1364 is the same as the corresponding description given for the propagation of a beam through a HSPMI.

Figure 4B:
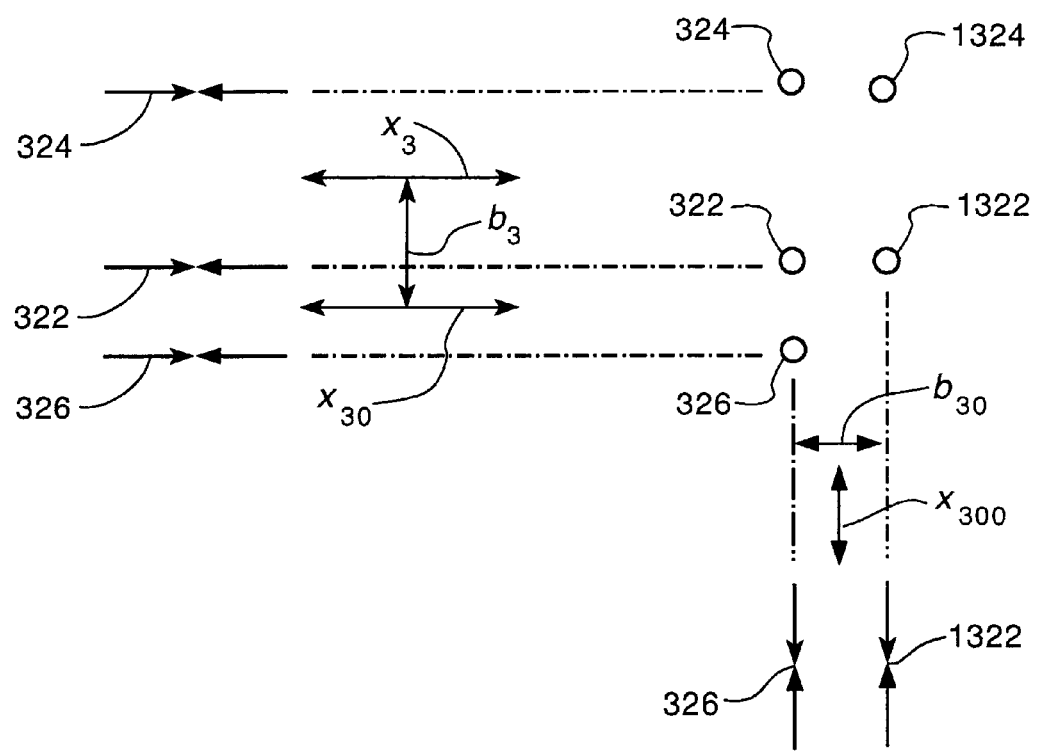
FIG. 4b shows the relative locations of the measurement beams in the third embodiment.

Measurement beams 322 and 324 are associated with measurement axis $x_3$, measurement beams 322 and 326 are associated with measurement axis $x_{30}$, and measurement beams 1322 and 1324 are associated with measurement axis $x_{300}$ (see FIG. 4b). The spatial separation of $x_{30}$ and $x_3$ is $b_3$ and the spatial separation of $x_{300}$ and $x_{30}$ is $b_{30}$.

The relative locations of measurement beams 322, 324, 326, 1322, and 1324 are shown in FIG. 4b. Also shown in FIG. 4b are the relative locations of the measurement axes $x_3$, $x_{30}$, and $x_{300}$ and the measurement axis separations $b_3$ and $b_{30}$.

The changes in three degrees of freedom of mirror 92 are computed by electronic processor and computer 90 using the three measured linear displacements and measured properties of $b_3$ and $b_{30}$.

The features and advantages of the third embodiment such as with respect to a compact robust integral optical assembly, lower cost, the clear apertures, placement of retroreflector 350, determination of separation $b_3$, and reduced non-cyclic error effects are the same as corresponding features and advantages described for the first embodiment of the present invention.

Figure 5A:
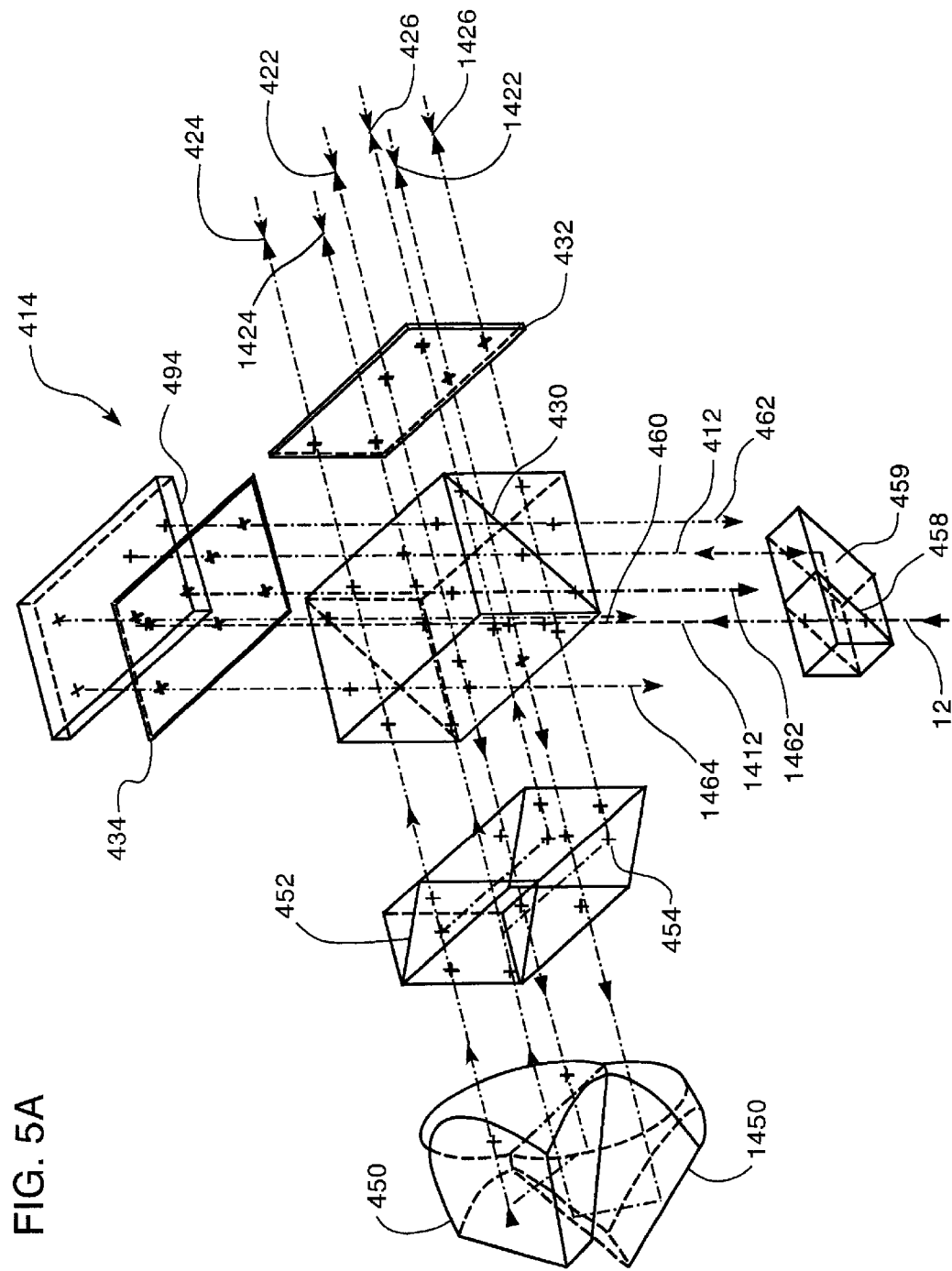
FIG. 5a is a perspective view of a fourth embodiment of a multi-axis interferometer.

A fourth embodiment of interferometer 14 is shown in a perspective view in FIG. 5a and comprises four plane mirror interferometers in an integral optical assembly generally shown as numeral 414. Interferometer 414 will be described for operation as interferometer 14 and is structured to measure and monitor changes in a linear displacement in one direction, the changes in angular orientation in two orthogonal planes, and a difference in average slopes of mirror 92. The paths of measurement beams 422, 424, 426, 1422, 1424, and 1426 correspond to the path indicated by numeral 20 in FIG. 1. Two of the four plane mirror interferometers have a common measurement beam path for one pass to a plane mirror measurement object 92 and the remaining two of the four plane mirror interferometers have a common measurement beam path for one pass to mirror 92. The common measurement beam paths correspond to the paths of measurement beams 322 and 1322.

Many elements of the fourth embodiment perform the same functions as elements of the first embodiment. The elements of the first and fourth embodiments performing the same functions are indicated by numerals that differ either by 300 or by 1300.

Beam 12 is incident on beam-splitter interface 458 and a first portion thereof is reflected as an input beam 412 after reflection by prism 459. A second portion of beam 12 is transmitted by beam-splitter interface 458 as an input beam 1412. Input beam 412 is incident on polarizing beam-splitter interface 430 and exits interferometer 414 as output beams 460 and 462. The measurement beams associated with output beams 460 and 462 are 422, 424, and 426. Input beam 1412 is incident on beam-splitter interface 430 and exits interferometer 414 as output beams 1460 and 1462. The measurement beams associated with output beams 1460 and 1462 are 1422, 1424, and 1426.

The description of the propagation of input beam 412 through interferometer 414 to form measurement beams 422, 424, and 426 and output beams 460 and 462 is the same as the corresponding description given for the description of the propagation of input beam 12 through interferometer 114 to form measurement beams 122, 124, and 126 and output beams 160 and 162 of the first embodiment. The description of the propagation of input beam 1412 through interferometer 414 to form measurement beams 1422, 1424, and 1426 and output beams 1460 and 1462 is the same as the corresponding description given for the description of the propagation of input beam 12 through interferometer 114 to form measurement beams 122, 124, and 126 and output beams 160 and 162 of the first embodiment.

Figure 5B:
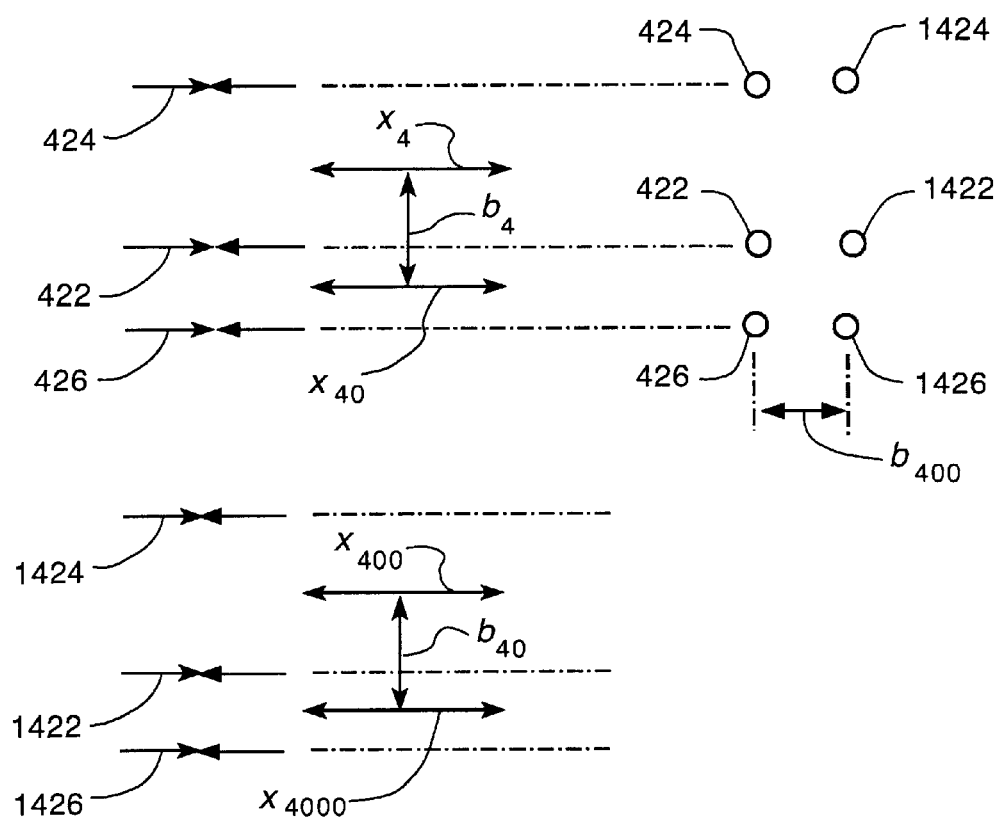
FIG. 5b shows the relative locations of the measurement beams in the fourth embodiment.

Measurement beams 422 and 424 are associated with measurement axis $x_4$, measurement beams 422 and 426 are associated with measurement axis $x_{40}$, measurement beams 1422 and 1424 are associated with measurement axis $x_{400}$, and measurement beams 1422 and 1426 are associated with measurement axis $x_{4000}$ (see FIG. 5b). The spatial separation of $x_{40}$ and $x_4$ is $b_4$, the spatial separation of $x_{4000}$ and $x_{400}$ is $b_{40}$, and the spatial separation of $x_{4000}$ and $x_{40}$ is $b_{400}$.

The relative locations of measurement beams 422, 424, 426, 1422, 1424, and 1426 are shown in FIG. 5b. Also shown in FIG. 5b are the relative locations of the measurement axes $x_4$, $x_{40}$, $x_{400}$, and $x_{4000}$ and the measurement axis separations $b_4$, $b_{40}$, and $b_{400}$.

The changes in three degrees of freedom of mirror 92 and a difference in average slopes are computed by electronic processor and computer 90 using measured changes in the four linear displacements and measured properties of $b_4$ and $b_{40}$. A change in an average slope of a slope is used herein to be the change in angular orientation of the surface determined from the difference in the changes in two linear displacements of the surface.

The change in average slope is in the plane of the two measured changes in linear displacement. In the fourth, two independent measurements of average slopes are obtained as $\operatorname{atan}[(x_{40}-x_4)/b_4]$ and $\operatorname{atan}[(x_{4000}-x_{400})/b_{40}]$. The difference $\operatorname{atan}[(x_{40}-x_4)/b_4]-\operatorname{atan}[(x_{4000}-x_{400})/b_{40}]$ measures the departure surface of mirror 92 from a plane over the distance $b_{400}$. A measured difference in average slopes can be used, for example, in procedures to map the surface of a plane mirror object mounted on a stage of a lithographic tool such as described in commonly owned U.S. Patent Application Serial No. 60/371,172 filed Apr. 9, 2002 and entitled "Method And Apparatus For Stage Mirror Mapping" by Henry Allen Hill (Z-402), the contents are incorporated herein by reference.

Figure 11:
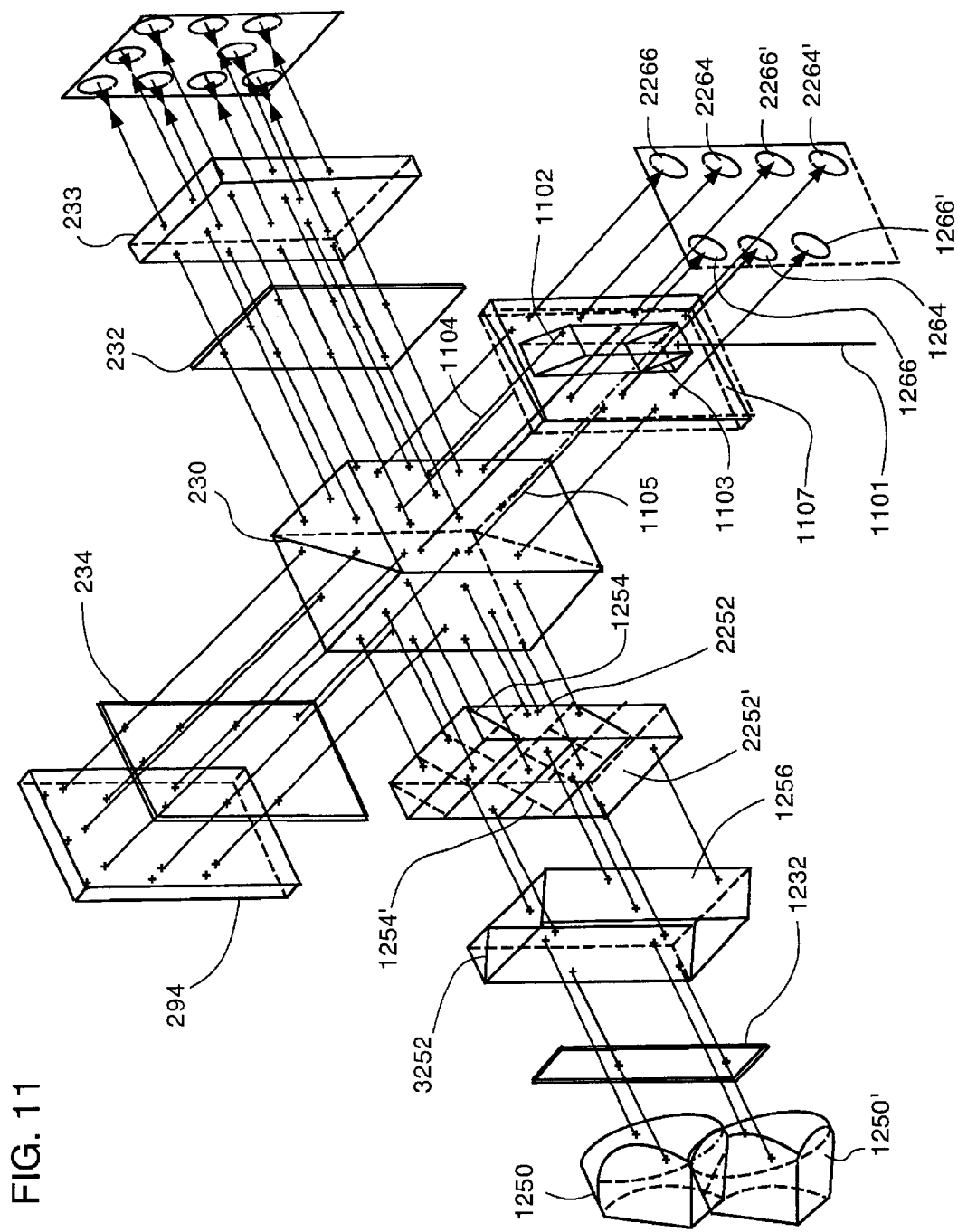
FIG. 11 is a perspective view of another embodiment of the interferometer to integrates together two interferometers like that of FIG. 10.

Additional embodiments may further combine any of the interferometer systems described above with one another to provide additional measurement axes. For example, a 4-axis and 3-axis interferometer subassemblies, similar to that shown in FIG. 10, may stacked in an integral optical assembly to provide 7 measurement axes as shown in FIG. 11. The embodiment in FIG. 11 includes many elements in common with the embodiment of FIG. 10 including polarizing beam splitter interface 230, measurement quarter-wave plate 232, reference quarter-wave plate 234, reference plane mirror 294, retardation plate 1232, retroreflector 1250, non-polarizing beam-splitter interfaces 2252 and 3252, and mirrors 1254 and 1256.

Referring to FIG. 11, an input beam 1101 (like that produced by source 10 in FIG. 1) is incident on an input beam splitting assembly 1102 including non-polarizing beam-splitting interface 1103. The input beam splitting assembly separates the input beam into two secondary input beams 1104 and 1105. Secondary input beam 1104 corresponds to input beam 12 in the embodiment of FIG. 10 and propagates through the interferometer to generate output beams 1264, 1266, 2264, and 2266 in the same manner as that of the embodiment of FIG. 10. Secondary input beam 1105 propagates parallel to secondary input beam 1104 but below it. Secondary input beam 1105 and its components propagates within the interferometer similarly to those of secondary input beam 1104 to generate output beams 1266', 2264', and 2266'. To produce such output beams the embodiment further includes mirror 1254', non-polarizing beam-splitting interface 2252', and a second retroreflector 1250'. In this particular embodiment, the measurement beam components of output beams output beams 1264, 1266, 2264, and 2266 contact a different plane mirror measurement object than that of the measurement beam components corresponding to output beams 1266', 2264', and 2266'. Moreover, in this particular embodiment, a fourth output beam derived from secondary input beam 1105 is not necessary, and so the right portion of beam-splitting interface 2252' is just a mirror.

Referring still to FIG. 11, the embodiment further shows backing plate 233, which is used to secure quarter-wave plate 232 to the polarizing beam-splitter optic corresponding to interface 230 when the different components are integrated together into a single interferometric assembly. The embodiment further shows polarization leakage filter 1107 comprising a pair of wedges, one of which is birefringent. The polarization leakage filter introduces a small difference in propagation direction between the orthogonally polarized components of the secondary input beams, which is ultimately compensated when the output beams pass through the polarization leakage filter. The polarization leakage filter can reduce cyclic errors caused by polarization mixing and other effects caused by imperfections in the interferometer optics. Embodiments of the polarization leakage filter are described in more detail in commonly owned U.S. patent application Ser. No. 10/174,149 entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS" by Peter J. de Groot et al. and filed Jun. 17, 2002, the contents of which are incorporated herein by reference.

In the embodiments described above each output beam includes information about changes in distance to the measurement object with respect to a particular measurement axis. As described above, information about changes in the angular orientation of the measurement object may be computed from distance measurements corresponding to two different measurement axes. In additional embodiments to be described below, the multi-axis interferometer can produce one or more output beams that directly measure changes in the optical orientation of the measurement object. In such embodiments, the "angle-measuring" output beams include two components that contact the measurement object at points that are spaced from one another. The resulting interference signal corresponds to an optical differencing that is indicative of changes to the angular orientation of the measurement object with respect to a particular rotation axis. Embodiments may include interferometers that measured changes in angular orientation with respect to one or more different rotation axis. Moreover, such interferometers may further include output beams that measure changes in distance to the measurement object along one or more measurement axes.

Referring now to FIGS. 12a–e, an embodiment of a multi-axis interferometer is shown that includes a high-stability plane mirror interferometer (HSPMI) and an angular displacement interferometer. The HSPMI and angular displacement interferometer share some common optical components. The HSPMI is shown in schematic form in FIG. 12b and the angular displacement interferometer is shown in schematic form in FIG. 12c. The HSPMI produces a first output beam 1272 that includes information about changes in distance to a plane mirror measurement object 1280 along a first measurement axis and the angular displacement interferometer produces a second "angle-measuring" output beam 1273 that includes information about changes in an angular orientation of the plane mirror measurement object with respect to a first rotation axis.

Figure 12A:
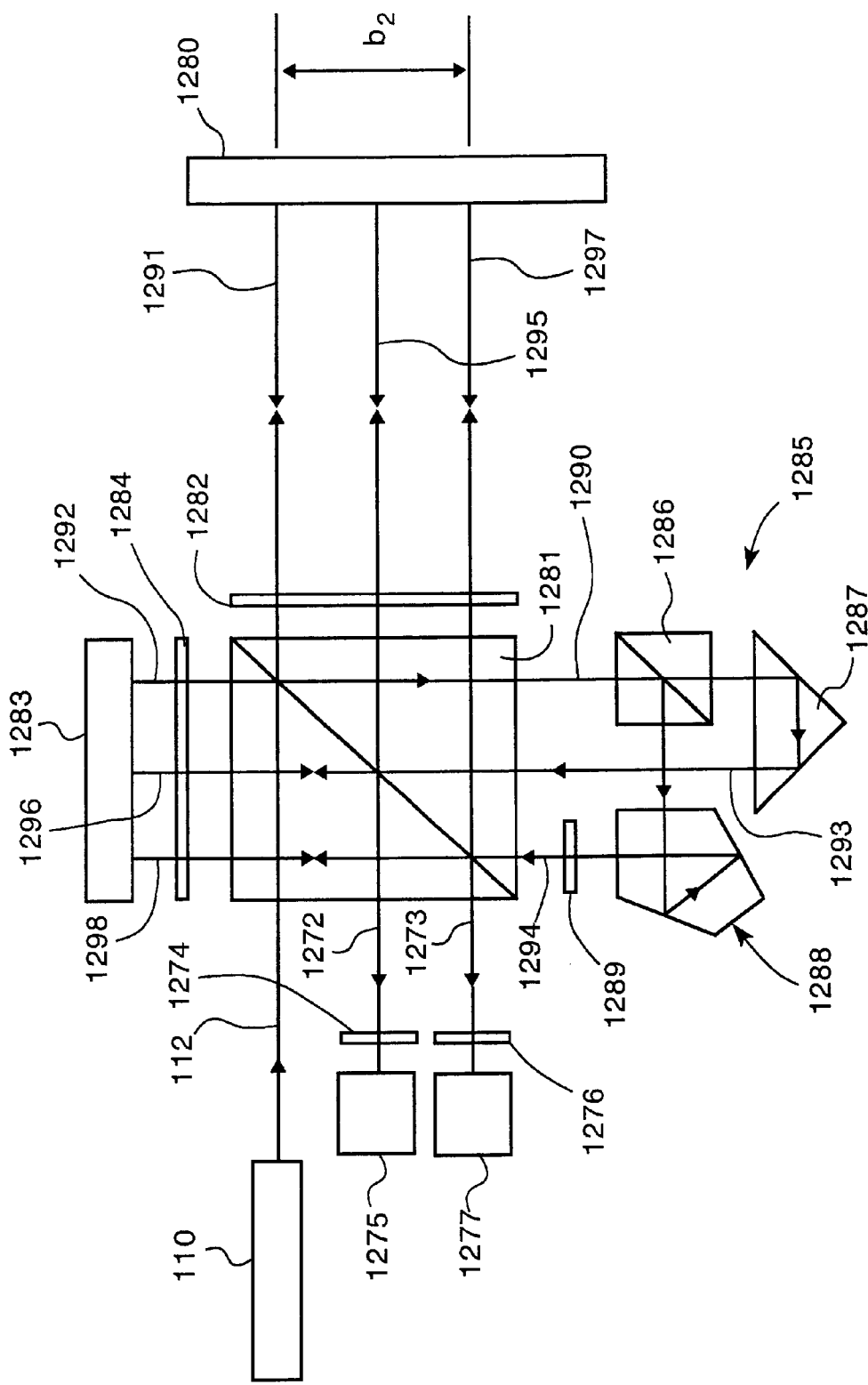
FIG. 12a is a plan view of another embodiment of an interferometric system.

Referring to FIG. 12a, source 110 produces input beam 112 (as described above with reference to FIG. 1) and directs it to polarizing beam-splitter 1281, which separates it into beams 1291 and 1292. Beam 1291 may thought of as a "primary" measurement beam and beam 1292 may be thought of as a primary reference beam. The primary measurement beam is transmitted by the polarizing beam-splitter, reflects from a plane mirror measurement object 1280, and then returns to the polarizating beam-splitter after double passing a quarter-wave retardation plate 1282, which rotates its linear polarization by 90 degrees. Because of the double pass, the polarizating beam-splitter now reflects the primary measurement beam towards return beam assembly 1285. The primary reference beam is reflected by the polarizing beam-splitter, reflects from a plane mirror reference object 1283, and then returns to the polarizing beam-splitter after double passing a quarter-wave retardation plate 1284, which rotates its linear polarization by 90 degrees. Because of the double pass, the polarizating beam-splitter now transmits the primary reference beam. Moreover, it combines the primary reference beam with the primary measurement beam to define intermediate beam 1290.

Return beam assembly 1285 includes a non-polarizing beam-splitter 1286 that separates the intermediate beam into multiple beams including beam 1293, which is transmitted by beam-splitter 1286 and then directed back to polarizing beam-splitter 1281 by retroreflector 1287, and beam 1294, which is reflected by beam-splitter 1286, redirected towards polarizing beam-splitter 1281 by penta-prism 1288, and then transmitted by half-wave retardation plate 1289 prior to reaching the polarizing beam-splitter. The half-wave retardation plate is oriented to rotate the linear polarizations of the measurement and reference components in beam 1294 by 90 degrees.

Figure 12B:
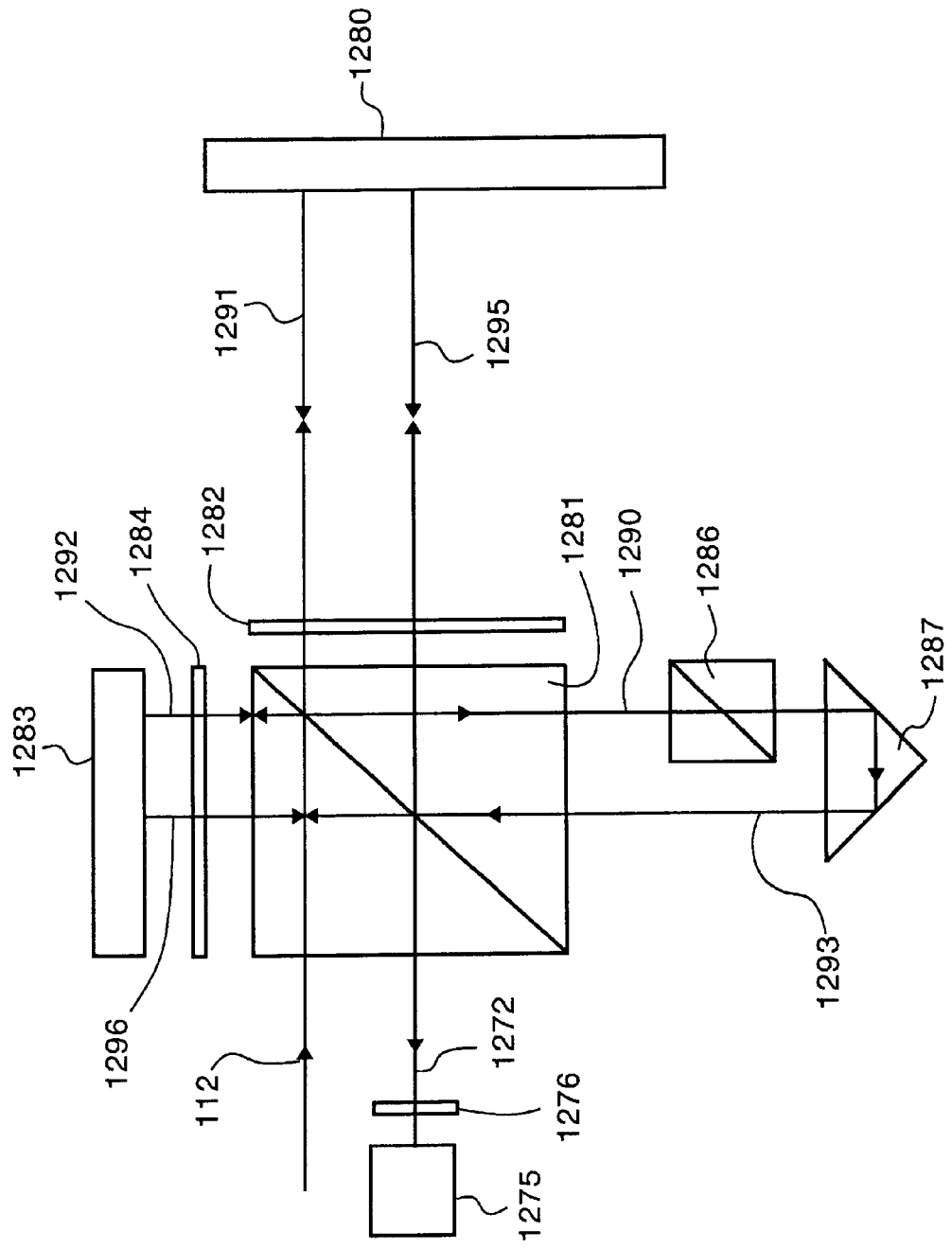
FIG. 12b is a plan view of a distance-measuring portion of the interferometric system.

Beam 1293 is a precursor to distance-measuring output beam 1272 and the polarizing beam-splitter reflects a first portion of it towards the plane mirror measurement object to define a secondary measurement beam 1295 and transmits a second portion of it to the plane mirror reference object to define a secondary reference beam 1296. Beams 1295 and 1296 reflect from their respective plane mirrors, double pass their respective quarter-wave retardation plates, and are then recombined by the polarizing beam-splitter to form distance-measuring output beam 1272. Notably, secondary measurement beam 1295 is derived from primary measurement beam 1291 and secondary reference beam 1296 is derived from primary reference beam 1292. Thus, the measurement beam component of distance-measuring output beam 1272 contacts the measurement object twice, a first time along a common path defined by the primary measurement beam and a second time along a different path defined by secondary measurement beam 1295. The orthogonal polarizations of the measurement and reference components of the distance-measuring output beam are then mixed by polarizer 1274 and the intensity of the resulting beam is measured by detector 1275. FIG. 12*b* shows the portions of the interferometer that form the HSPMI and produce the distance-measuring output beam.

Figure 12C:
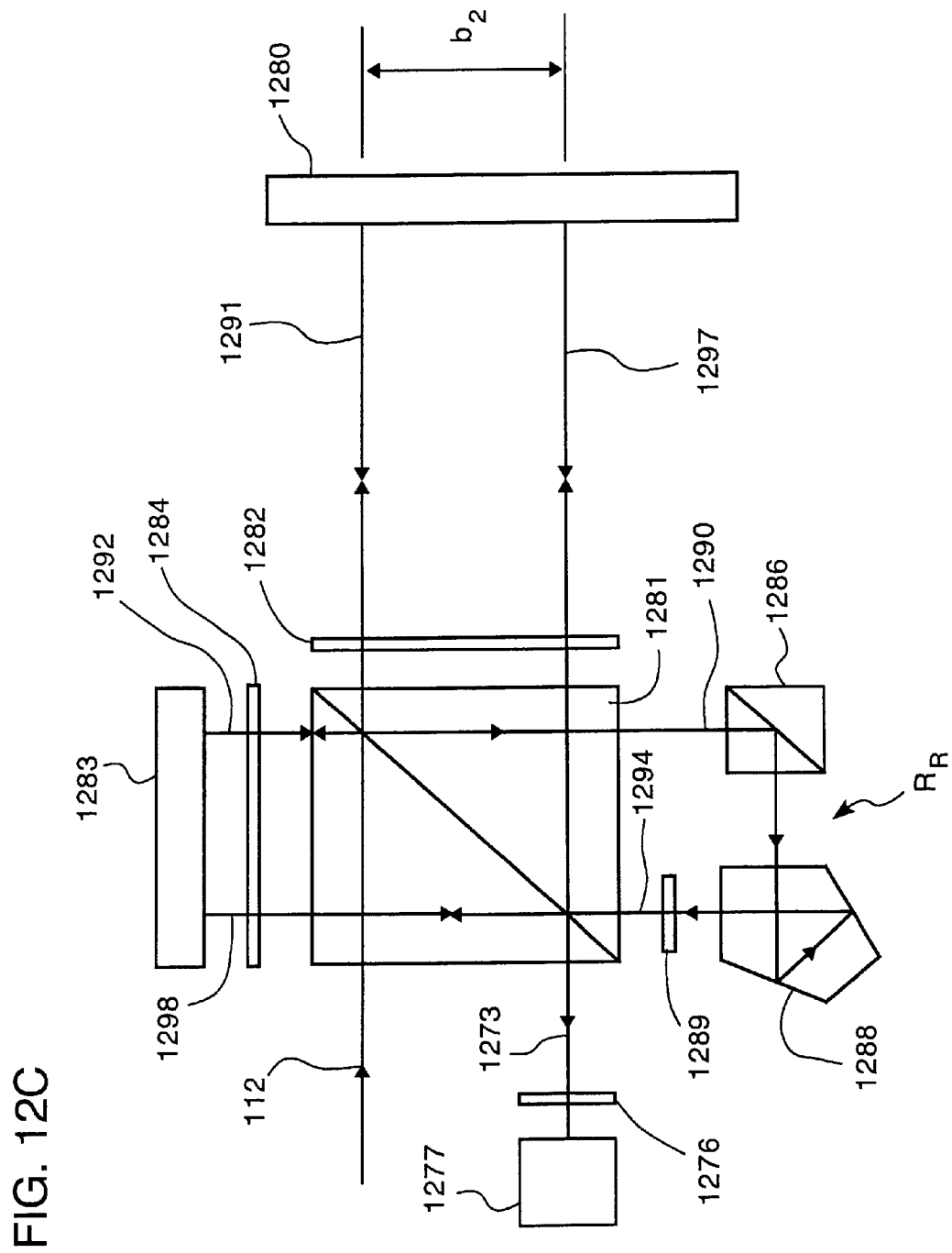
FIG. 12c is a plan view of an angular-measuring portion of the interferometric system.

Beam 1294 is a precursor to angle-measuring output beam 1273 and the polarizing beam-splitter reflects a first portion of it towards the plane mirror measurement object to define another secondary measurement beam 1297 and transmits a second portion of it to the plane mirror reference object to define another secondary reference beam 1298. Beams 1297 and 1298 reflect from their respective plane mirrors, double pass their respective quarter-wave retardation plates, and are then recombined by the polarizing beam-splitter to form angle-measuring output beam 1273. Notably, because of the polarization rotation by half-wave retardation plate 1289, secondary measurement beam 1297 is derived from primary reference beam 1292 and secondary reference beam 1298 is derived from primary measurement beam 1291. Thus, a first component of angle-measuring output beam 1273 contacts the measurement object once along the common path as part of the primary measurement beam and then contacts the reference object once as part of secondary reference beam 1298, and a second component of angle-measuring output beam 1273 contacts the reference object as part of the primary reference beam and then contacts the measurement object once along a path different from the common path as part of secondary measurement beam 1297. The orthogonal polarizations of the first and second components of the angle-measuring output beam are then mixed by polarizer 1276 and the intensity of the resulting beam is measured by detector 1277. FIG. 12*c* shows the portions of the interferometer that form the angular displacement interferometer and produce the angle-measuring output beam.

The angular displacement interferometer introduces a relative phase shift $\phi_2$ between the components of output beam 1273 of the angular displacement interferometer for a change $\theta_2$ in the angular orientation of the plane mirror measurement object in the planes of FIGS. 12*a* and 12*c*. Relative phase shift $\phi_2$ and angular change $\theta_2$ are related according to the formula $$\phi_2 = k_2 n_2 b_2 \theta_2 \qquad (1)$$

where $b_2$ is the spacing between the reference beam and measurement beam (see FIGS. 12*a* and 12*c*) at the plane mirror, wavenumber $k_2 = 2\pi/\lambda_2$ for wavelength $\lambda_2$ of input beam 112, and $n_2$ is the index of refraction of a gas in the reference and measurement beam paths.

Figure 12D:
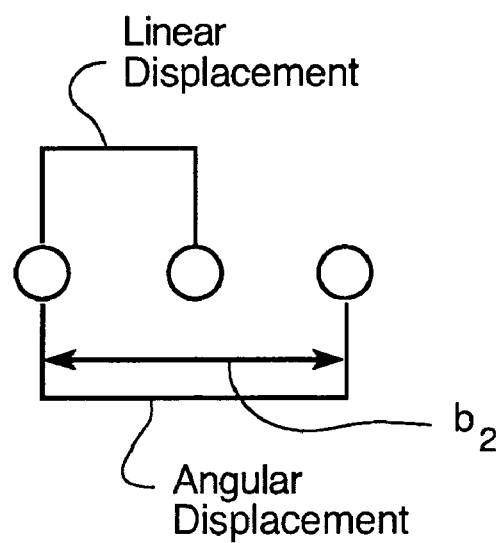
FIG. 12d is a diagram depicting the arrangement of beam spots on the a plane mirror measurement object.
Figure 12E:
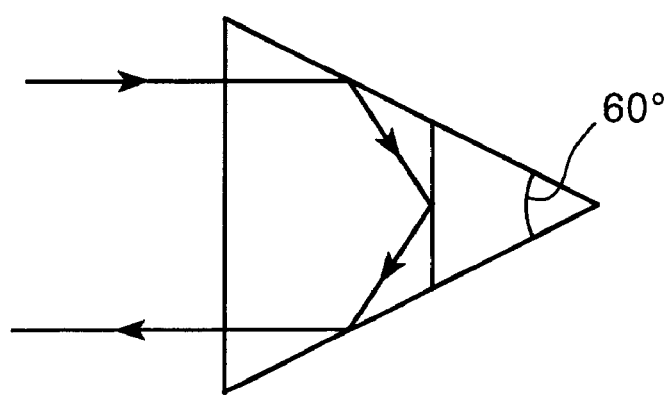
FIG. 12e is a schematic diagram of a component that can be used in a variation of the interferometric system.

The arrangement of the beam spots on the plane mirror measurement object 1280 is shown in FIG. 12*d*. The spots form a linear array with the measurement axis for the linear displacement interferometer displaced from a line parallel to and centered between the reference and measurement beams of the angular displacement interferometer. For the interferometer assembly shown schematically for the embodiment of FIG. 12*a* as a non-limiting example, the displacement is equal to nominally one half of the separation of the measurement beams of the linear displacement interferometer at the plane mirror.

The combination of non-polarizing beam-splitter 1286 operating as a mirror and penta prism 1288 that is indicated as R in FIG. 12*c* has the image inverting properties of a single reflecting surface. As a result, the angular displacement interferometer shown in FIG. 12*a* is configured such that the components of the angle-measuring output beam propagate parallel to one another even when the primary and secondary measurement beams contact the measurement object at non-normal incidence. Moreover, it is configured so that there is a reduced relative beam shear between the components of the angle-measuring output beam within the angular displacement interferometer and at detector 1294 or an optical fiber pickup. The relative beam shear is equal to $2\alpha_2 l_2 / n'_2$ where $\alpha_2$ is a change in angular orientation of the plane mirror measurement object in the plane of FIG. 12*a*, $l_2$ is the difference in physical lengths of the reference and measurement beams from the single plane mirror to the polarizing beam splitter 1281 where they are combined in the angular displacement interferometer, and $n'_2$ is the index of refraction of the glass in the interferometer. The length $l_2$ is independent of linear displacements of the plane mirror measurement object. Also, the angular displacement interferometer shown in FIG. 12*a* is configured so that the path lengths in glass are the same for the different output beam components, wherein the angular displacement interferometer is insensitive to changes in temperature of the angular displacement interferometer. The angular displacement interferometer is further configured so that the path lengths in the gas are the same for the different output beam components, wherein the angular displacement interferometer is insensitive to environmental changes in the density of the gas in the corresponding beam paths.

An advantage of the embodiment of FIG. 12*a* is that the beams used in the measurement of angular displacements make single passes to the plane mirror measurement object. The single pass configuration for the angular displacement interferometer has a reduced number of sources for generation of cyclic non-linearities as compared to the number of sources possible in a multi-pass interferometer configuration. However, in additional embodiments of the invention, the angular displacement interferometer may also be configured so that the beams used in the angular displacement interferometer make multiple passes to the measurement object.

Another advantage of the embodiment of FIG. 12*a* is that the linear and angular displacement output beams have a common measurement beam path in a pass to the plane mirror measurement object. That path corresponds to the path of the component of input beam 112 transmitted by the polarizing beam splitter as primary measurement beam 1291.

Another advantage of the embodiment of FIG. 12*a* is that the position of the beams on the plane mirror measurement object that ared used in the angular displacement interferometer do not shear as the angular orientation of the measurement object changes. This is a consequence of the fact that the each component in the angle-measuring output beam only contacts the plane mirror measurement object once.

The combination of the non-polarizing beam-splitter operating as a mirror and the Penta prism that is indicated as R in FIG. 12*c* has as cited above the image inverting properties of a single reflecting surface. The combination of the reflection by the non-polarizing beam-splitter and the Penta prism indicated as R in FIG. 12c also has the image inverting properties of the multiple-reflecting-surface reflector shown in FIG. 12e. The reflector shown in FIG. 12e may alternatively be used in place of reflector R with one facet of the reflector in FIG. 12e serving the function of the non-polarizing beam-splitter.

Additional embodiments may include other combinations of reflective surfaces in the return beam assembly to provide the image inverting properties of a single reflecting surface described above. In general, the set of reflective surfaces reflect angle-measuring portion of the intermediate beam such that a sum of angles between incident and reflected beams at each of the reflective surfaces is zero or an integer multiple of 360 degrees, wherein each angle is measured in a direction from the incident beam to the reflected beam and has a positive value when measured in a counter clockwise direction and a negative value when measured in a clockwise direction. In many embodiment, there are an odd number of reflections from surfaces that have normals in a common plane.

Figure 13A:
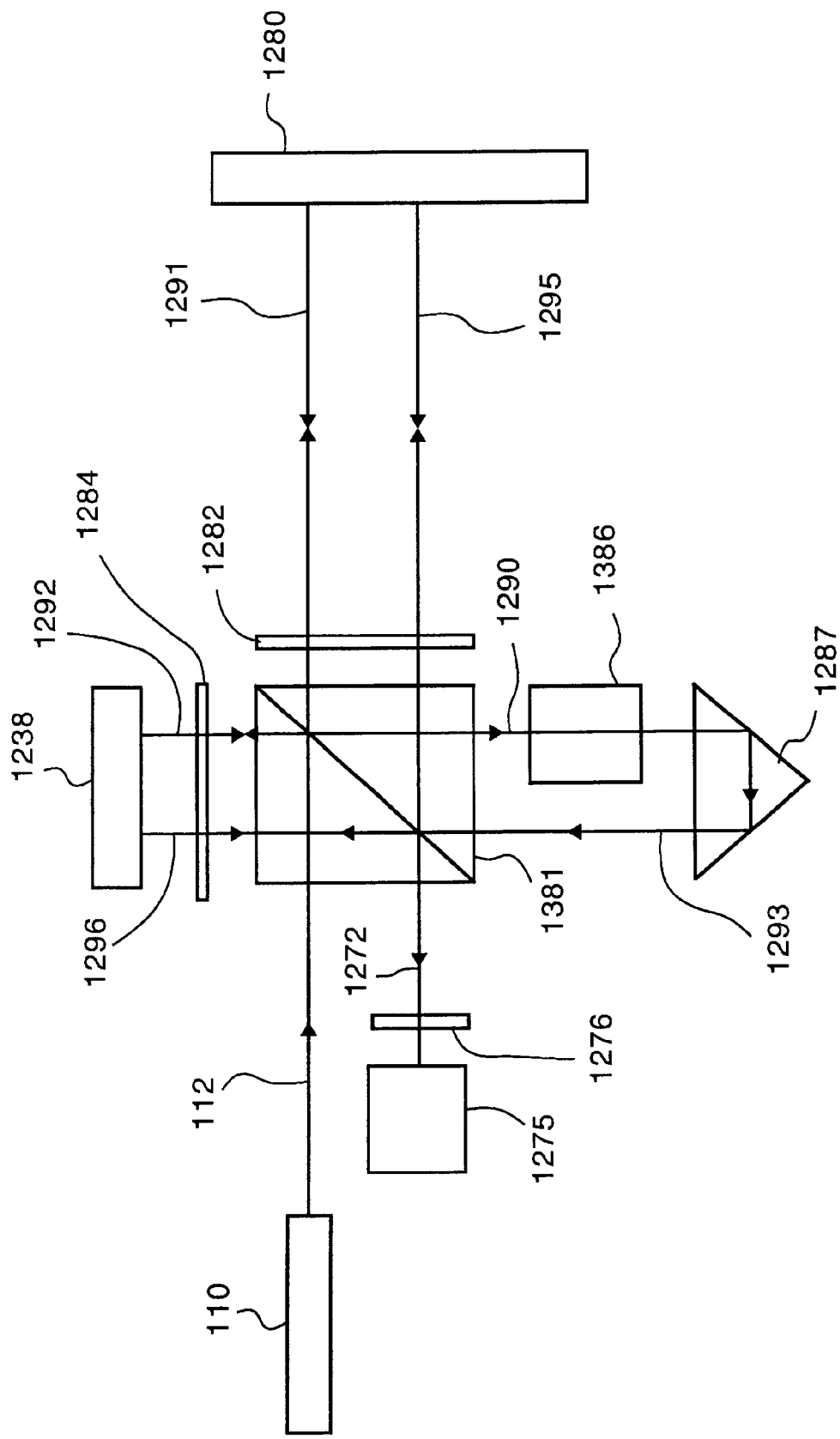
FIGS. 13a, 13b, and 13c are plan views of yet another embodiment of an interferometric system.
Figure 13B:
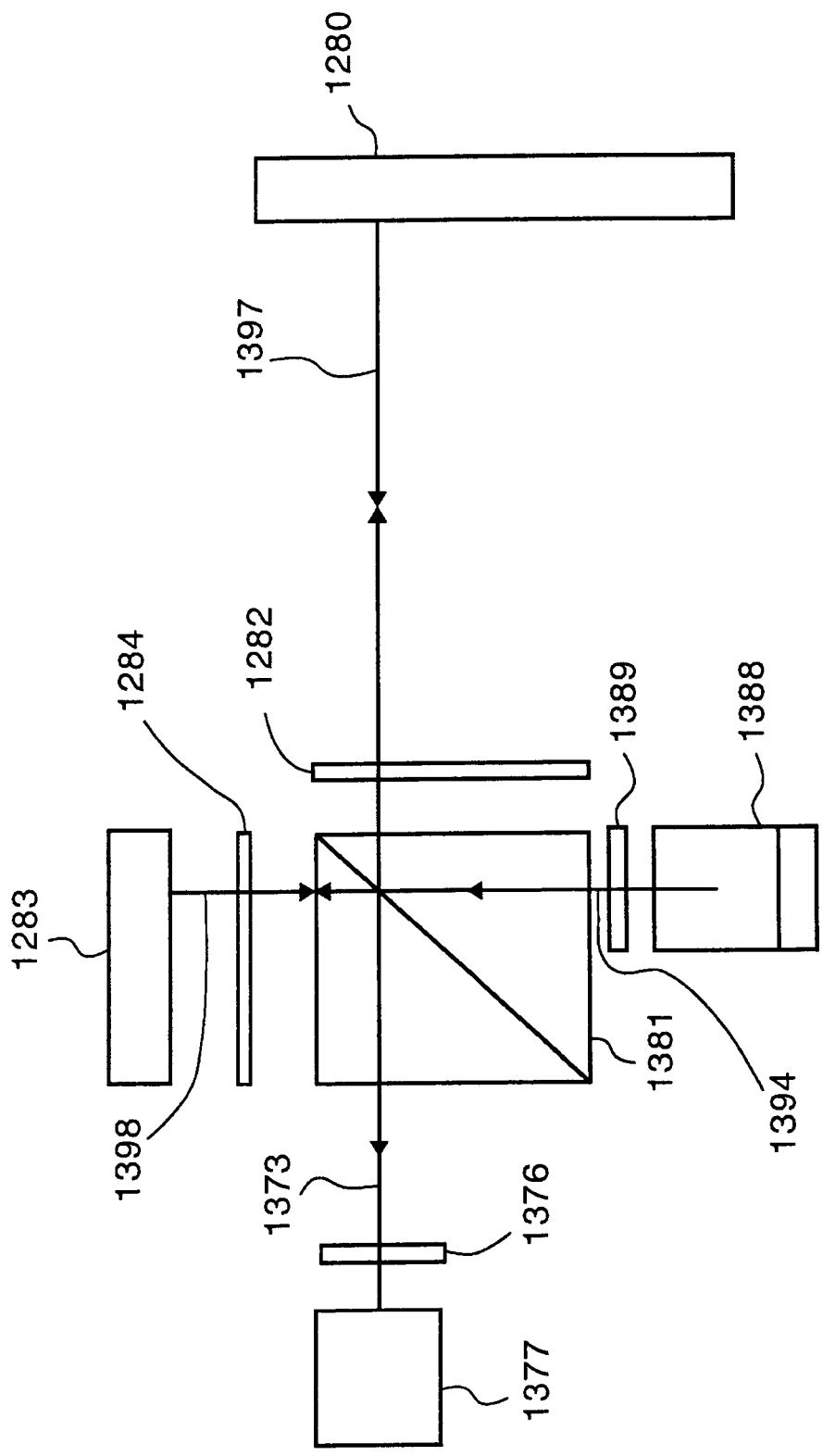
Figure 13C:
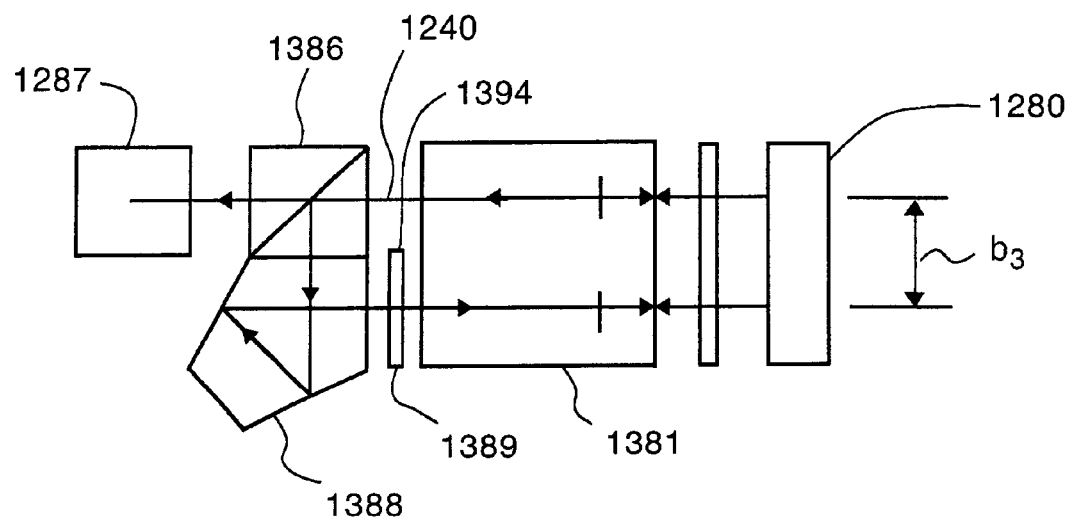

FIGS. 13a, 13b, and 13c depict in schematic form another embodiment of the interferometer of the present invention. The embodiment is similar to that of FIG. 12a in that it includes both a linear displacement interferometer (e.g., a HSPMI) and an angular displacement interferometer. However, in the present embodiment the plane of the measurement beams of the linear displacement interferometer and the plane in which angular displacements are measured are orthogonal. The planes of FIGS. 13a and 13b are parallel and displaced one with respect to the other by distance $b_3$ as shown in FIG. 13c. FIG. 13c depicts in schematic form a view of the interferometer assembly as seen from the side. Many of the elements of the interferometer are identical to those of the embodiment of FIG. 12a and have the same reference numerals.

The linear displacement interferometer in the embodiment of FIGS. 13a–13c is an HSPMI identical that in the embodiment of FIG. 12a. The plane defined by the reference and measurement beams of the HSPMI lies in the plane of FIG. 13a.

The operation of the angular displacement interfeometer in the embodiment of FIGS. 13a–13c is identical to that of the embodiment of FIG. 12a up to the generation of intermediate beam 1290. In the subsequent manipulation of the intermediate beam, non-polarizing beam-splitter 1386 replaces beam-splitter 1286 and penta prism 1388 replaces penta prism 1288. Also, polarizing beam-splitter 1381 replaces polarizing beam-splitter 1281.

Referring to FIGS. 13a–13c, beam-splitter 1386 receives intermediate beam 1290 and reflects a portion of it out of the plane of FIG. 13a, where it reflected by penta-prism 1388 back towards polarizing beam-splitter 1381 in the plane of FIG. 13b, and passes through half-wave retardation plate 1389 prior to reaching the polarizing beam splitter as beam 1394. As in the embodiment of FIG. 12a, the half-wave retardation plate rotates the linear polarizations of the components of beam 1394 by 90 degrees.

Beam 1394 is a precursor to an angle-measuring output beam 1373 and the polarizing beam-splitter reflects a first portion of it towards the plane mirror measurement object to define another secondary measurement beam 1397 and transmits a second portion of it to the plane mirror reference object to define another secondary reference beam 1398. Beams 1397 and 1398 reflect from respective plane mirrors 1280 and 1283, double pass respective quarter-wave retardation plates 1282 and 1284, and are then recombined by the polarizing beam-splitter to form angle-measuring output beam 1373. Because of the polarization rotation by half-wave retardation plate 1389, secondary measurement beam 1397 is derived from primary reference beam 1292 and secondary reference beam 1398 is derived from primary measurement beam 1291. Thus, a first component of angle-measuring output beam 1373 contacts the measurement object once along the common path as part of the primary measurement beam and then contacts the reference object once as part of secondary reference beam 1398, and a second component of angle-measuring output beam 1373 contacts the reference object as part of the primary reference beam and then contacts the measurement object once along a path different from the common path as part of secondary measurement beam 1397. The orthogonal polarizations of the first and second components of the angle-measuring output beam are then mixed by polarizer 1376 and the intensity of the resulting beam is measured by detector 1377.

The angular displacement interferometer introduces a relative phase shift $\phi_3$ between the components of angle-measuring output beam 1373 for a change $\theta_3$ in the angular orientation of the plane mirror measurement object in the plane orthogonal to the plane of FIG. 13b. Relative phase shift $\phi_3$ and angular change $\theta_3$ are related according to the formula $$\phi_3 = k_3 n_3 b_3 \theta_3 \tag{2}$$

where $b_3$ is the spacing between the reference beam and measurement beam (see FIG. 13c), wavenumber $k_3 = 2\pi/\lambda_3$ for wavelength $\lambda_3$ of the input beam 112, and $n_3$ is the index of refraction of a gas in the reference and measurement beam paths.

Figure 13D:
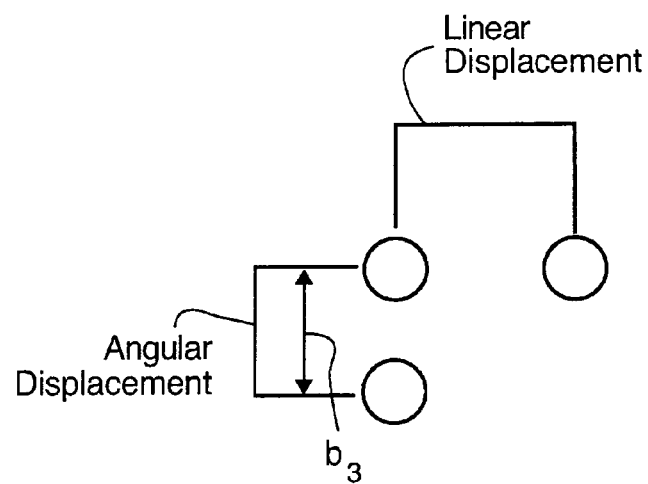
FIG. 13d is a diagram depicting the arrangement of the beam spots on the plane mirror measurement object of the interferometric system.

The arrangement of the beam spots on the plane mirror measurement object is shown in FIG. 13d. The embodiment of FIGS. 13a–13c includes advantages similar to those described above.

Figure 14A:
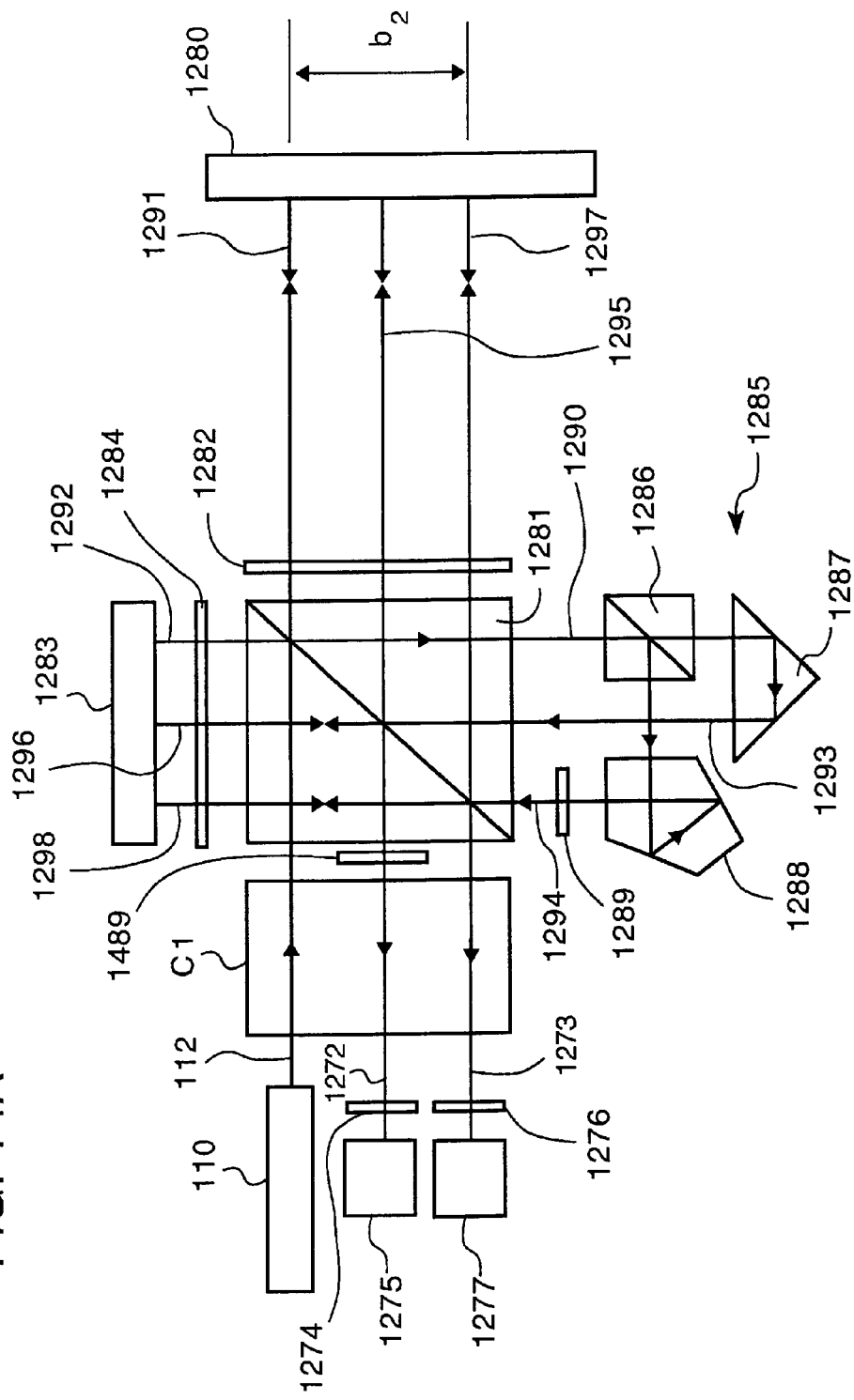
FIGS. 14a and 14b are plan views of yet additional embodiment of an interferometric system that include one or more compenator elements.

FIG. 14a depicts in schematic form another embodiment of the interferometer of the present invention. The embodiment is identical to that of FIG. 12a except that it further includes a compensating element C1 and a half-wave retardation plate 1489 positioned to receive distance-measuring output beam 1272 prior to element C1. Many of the elements of the interferometer are identical to those of the embodiment of FIG. 12a and have the same reference numerals.

The function of element C1 is to further reduce or even eliminate the reduced relative beam shear between the reference and measurement beam components of the output beam of the angular displacement interferometer that is present in the second embodiment. Path lengths in glass and in a gas for the reference and measurement beams of the angular displacement interferometer are maintained equal. The compensating element(s) makes the beams that corresponds to the two components in the angle-measuring output beam have an equal path lenght from when they contact the measurement object to when they are combined by the polarizing beam splitter to produce the angle-measuring output beam. As a result, any transverse displacement caused by the non-normal reflection of the angle-measuring beams from the measurement object is equal for the two components of the angle-measuring output beam.

Figure 14B:
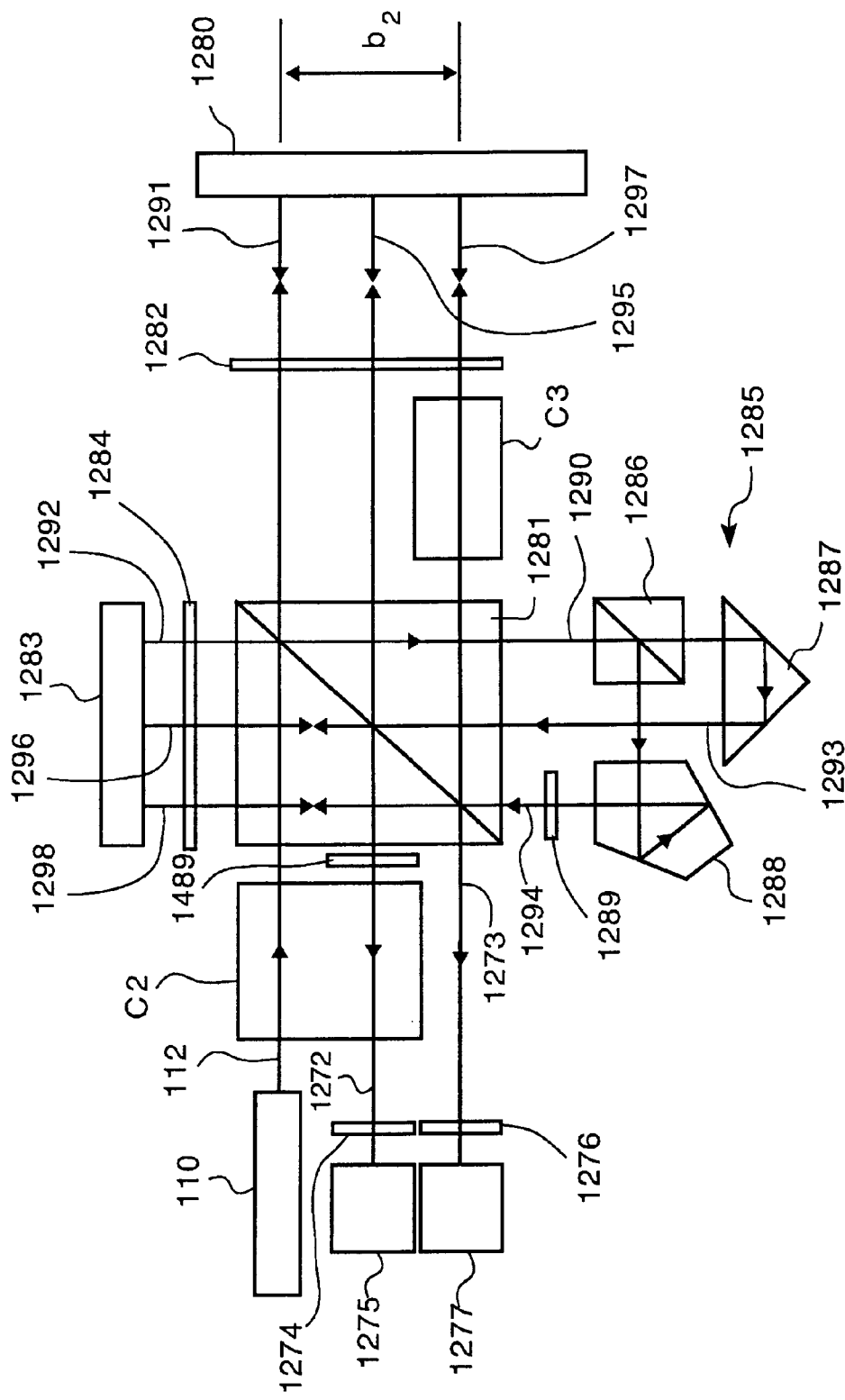
Figure 14C:
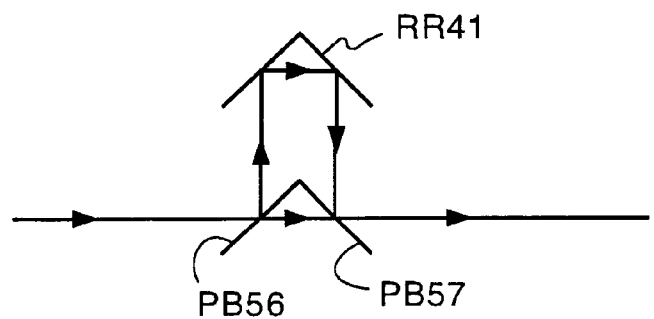
FIGS. 14c, 14d, and 14e are schematic diagrams of different types of compensating elements.
Figure 14D:
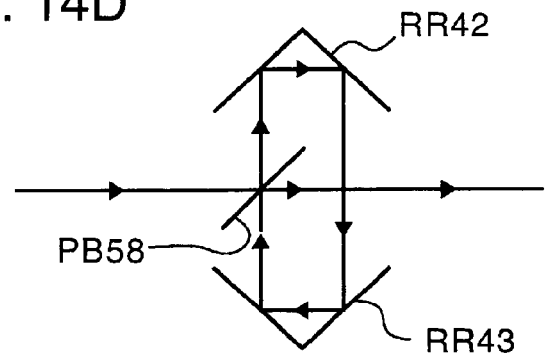
Figure 14E:
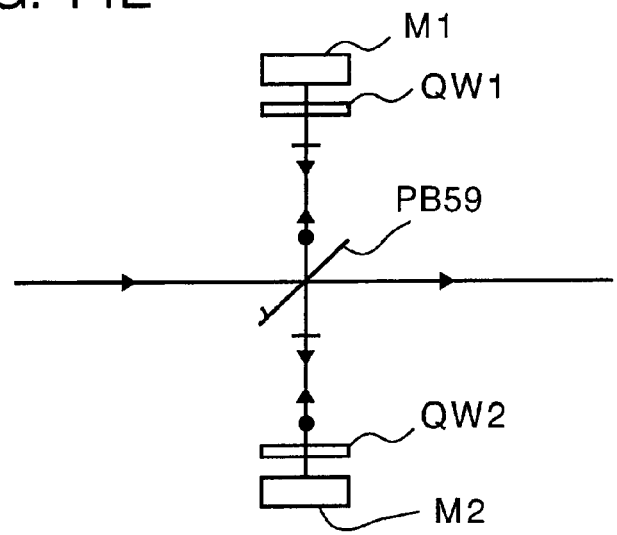

Three embodiments of element C1 are shown in FIGS. 14c, 14d, and 14e. The planes of FIGS. 14c, 14d, and 14e are orthogonal to the plane of FIG. 14a. The difference in path lengths for the reference and measurement beam components of the output beam of the angular displacement interferometer is equal to $l_2$ and the index of refraction of the glass in element C1 is the same as $n'_2$. As a consequence, there is no relative shear between the reference and measurement beam components of the output beam of the angular displacement interferometer in either the interferometer assembly or at a detector or at a fiber-optic pick-up (FOP).

FIG. 14c shows an embodiment of element C1 including two polarizing beam splitters PBS6 and PBS7 in conjunction with a retro reflector RR41.

FIG. 14d shows an embodiment of element C1 including a polarizing beam splitter PBS8, and two retro reflectors RR42 and RR43.

FIG. 14e shows an embodiment of element C1 including a polarizing beam splitter PBS9 in conjunction with two mirrors M1 and M2 and quarter waveplates QW1 and QW2.

The unbalance in reference and measurement beam path lengths in glass introduced by passage of the output beam from the angular displacement interferometer through element C1 is offset by the difference in optical path lengths experienced by the reference and measurement beam components of the input beam on passage through element C1. The half wave phase retardation plates shown in FIG. 14a rotate the polarizations of respective beams by 90 degrees so that the combination of the passage of the input beam and the output beams through element C1 gives rise to equal paths in glass for corresponding components of the output beams.

In addition to the further reduction in differential shear by compensating element C1, the embodiment of FIG. 14a includes advantages similar to those described above.

In further embodiments, one or more compensating elements may be deployed in a manner different from that of FIG. 14a. For example, compensating elements C2 and C3 may deployed as shown in FIG. 14b. In yet further embodiments, one or compensating elements may be similarly deployed in the embodiment shown in FIGS. 13a–13c to further reduce or even eliminate differential shear between the components of the angle-measuring output beam.

Figure 15A:
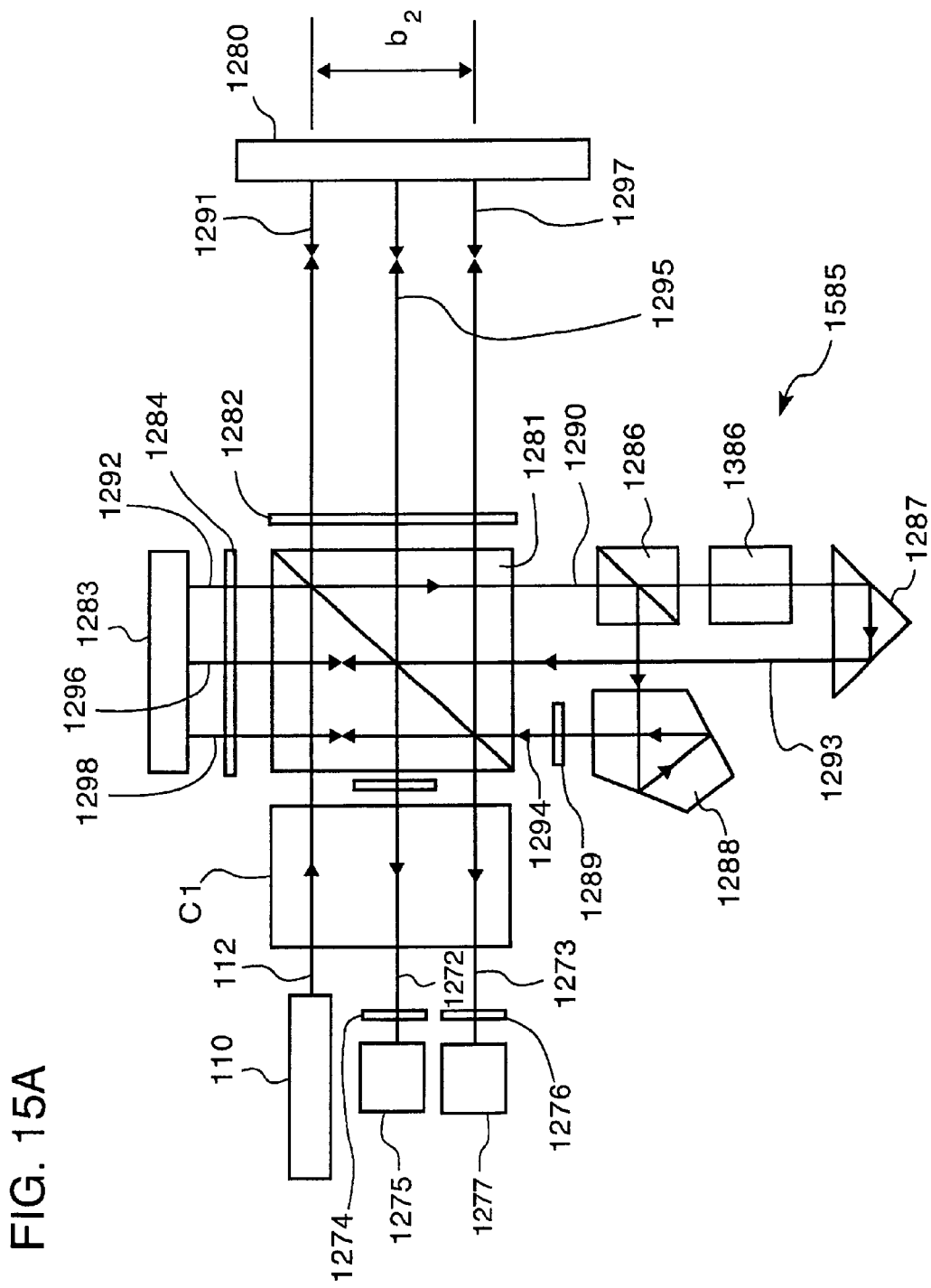
FIGS. 15a, 15b, and 15c are views of yet another additional embodiment of an interferometric system.
Figure 15B:
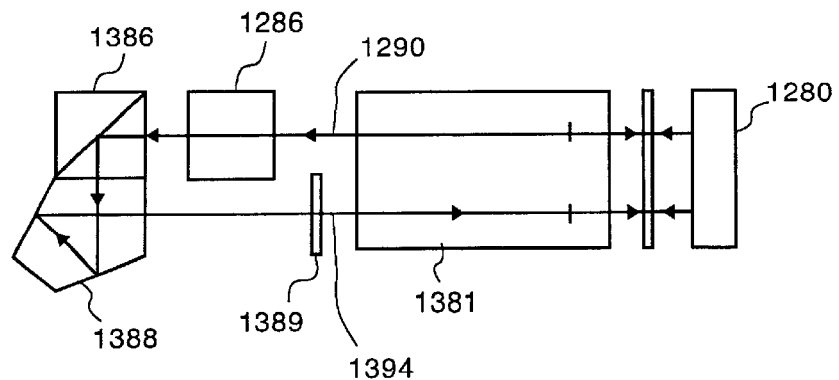
Figure 15C:
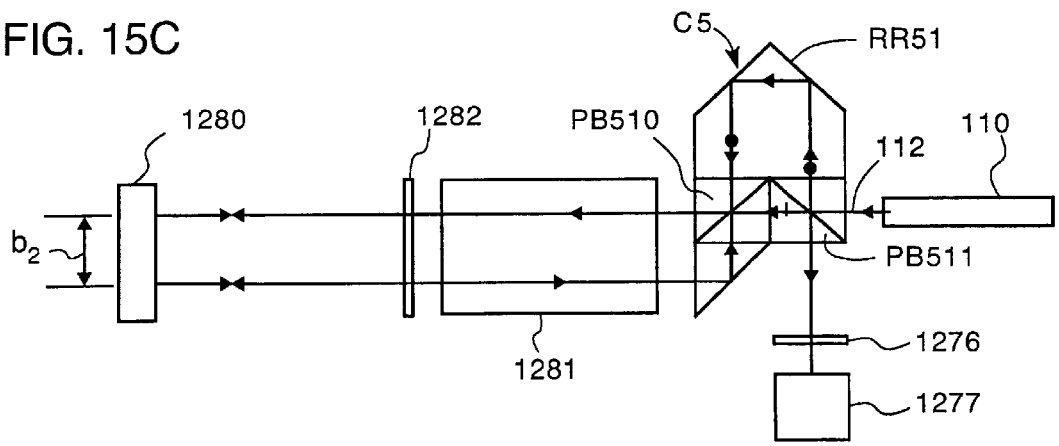

Another embodiment of the interferometer of the present invention is shown in FIGS. 15a–15c, which combines the elements of the embodiments of FIGS. 13a–13c and FIG. 14a to produce distance measuring output beam 1272 and two angle-measuring output beams 1273 and 1373. The two angle-measuring output beams measure changes in the angular orientation of plane mirror measurement object with respect to two rotation axes that are normal to one another. To generate the three output beam, return beam assembly 1585 includes both non-polarizing beam-splitters 1286 and 1386 and both penta prisms 1288 and 1388. The embodiment also includes compensating element C5 to further reduce differential shear between the components of angle-measuring output beams 1273 and 1373.

FIG. 15a shows a schematic diagram of the interferometer in the plane of distance measuring output beam 1272, angle-measuring output beam 1273, and the component beams used to produce those output beams. FIG. 15b shows a side-view of the interferometer including beam 1394, which is split to produce the secondary beams used to produce the second angle-measuring output beam, output beam 1373. FIG. 15c shows another side view of the interferometer.

The size of penta prism 1288 relative to the size of penta prism 1388 is designed so that the ratios of the beam shears and corresponding angular displacements of the plane mirror measurement object are the same for the output beam components of the two angular displacement interferometers. As a consequence, a single compensator C5 (see FIG. 15c) can be used for the linear displacement interferometer and the two angular displacement interferometers. The single compensator C5, shown in FIG. 15c, includes polarizing beam splitters PBS11 and PBS12, and retro reflector RR51.

Figure 15D:
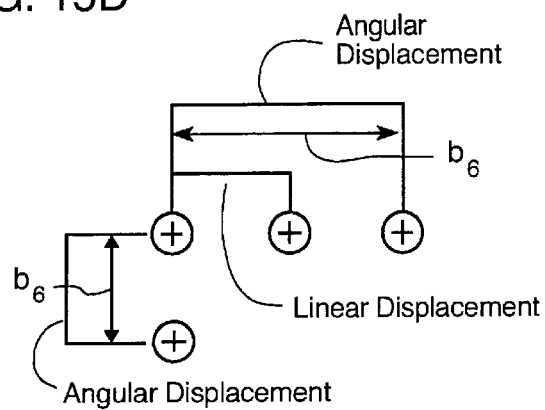
FIG. 15d is a diagram depicting the arrangement of the beam spots on the plane mirror measurement object of the interferometric system.

The arrangement of the beam spots on the plane mirror measurement object is shown in FIG. 15d. In addition to the further reduction in differential shear by compensating element C5, the embodiment of FIGS. 15a–c includes advantages similar to those described above.

Figure 6:
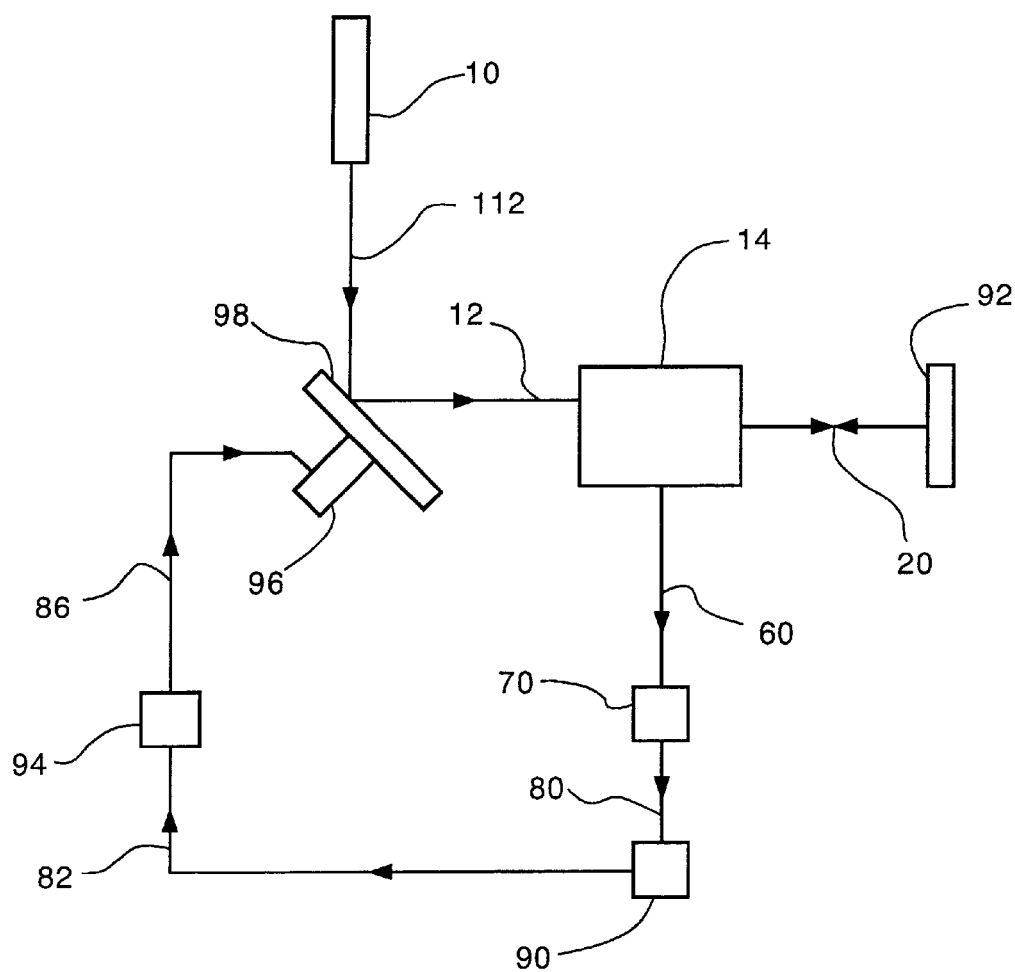
FIG. 6 is a schematic diagram of an interferometry system including dynamic beam steering element positioned to direct an input beam into the interferometer.

FIG. 6 is a diagrammatic view of an interferometer system by which linear and angular displacements of a plane mirror measurement object 92 are measured and monitored. As shown in FIG. 6, the interferometer system comprises an interferometer 14 which may be structured and arranged as any one of the interferometers described herein and a dynamic beam steering element that controls the direction of input beam 12 to interferometer 14.

The purpose of changing the direction of input beam 12 is to eliminate or substantially reduce the effects of non-cyclic errors in the electrical interference signals generated from output beams of interferometer 14. The elimination or substantial reduction of the effects of non-cyclic errors is achieved by the elimination or the substantial reduction of beam shears in interferometer 14 and at the detector 70.

The interferometer system further comprises source 10 that produces beam 112, detector 70, servo controller 94, transducer 96, and electronic processor and computer 90. With each interferometer type, interferometer beams travel to and from mirror 92 generally along an optical path designated as 20 and output beams travel from interferometer 14 to detector 70 along an optical path designated as 60. The description of beam 112 is the same as the description of beam 12 of FIG. 1.

The orientation of the beam steering element 98 is controlled by transducer 96 such that the measurement beams that travel along path 20 are incident on mirror 92 with an angle of incidence of zero degrees. Transducer 96 is controlled by servo control signal 86 from servo controller 94. Servo control signal 86 is derived from servo signal 82 that is generated by electronic processor and computer 90.

The control of dynamic element 98 may be in one of two modes. One mode is a feedback mode wherein the orientation of dynamic element 98 is controlled according to an error signal based for example on measured departures of the angles of incidence of the measurement beams at mirror 92 from zero degrees. The second mode is a feed forward mode wherein control signal 82 is based on measured changes in orientation of mirror 92. The measured changes may be based entirely or in part for example on the changes in orientation of mirror 92 as measured by interferometer 14.

Interferometer systems that include dynamic beam steering elements on the input beam to an interferometer are also described in commonly owned U.S. Pat. Nos. 6,252,667, 6,313,918, and 6,271,923 and in PCT Publication WO 00/66969, the contents of which are all incorporated herein by reference.

The precision to which the direction of measurement beams on path 20 need to be maintained/known is in general not the same as the precision to which changes in the angular orientation of mirror 92 need be measured/known by several orders of magnitude. The change in linear displacement measured by interferometer system 14 is nominally the change in a distance from a point defined by the beam steering element along a line orthogonal to the reflecting surface of mirror 92. A fractional error in the measured linear displacement introduced by a departure $\epsilon$ of the direction of the measurement beams from the orthogonal line will be $(1-\cos^2\epsilon) \cong \epsilon^2$. Thus for fractional errors of 1 ppb and 0.1 ppb for example, the corresponding values of $\epsilon$ need to be $\leq 3.2\times 10^{-5}$ and $\leq 1.0\times 10^{-5}$, respectively. Typical ranges of values $\theta$ are of the order of 0.001 radians where $\theta$ is the orientation of the reflecting surface of mirror 92 relative to the fixed reference frame of the lithography tool metrology system. Thus the precision to which $\epsilon$ need be known relative to $\theta$ is 3.2% and 1.0%, respectively. This feature of the present invention considerably relaxes the performance requirements of the control system for the dynamic beam steering element. This is particularly important for a feed forward control system.

Another consequence of the reduced precision required for $\epsilon$ is that the accuracy of a feed back or feed forward control system is easily determined in situ. One example of a procedure for calibration of the control system is to scan the orientation of the beam steering element for a series of fixed orientations of mirror 92 and detect the location where $\epsilon=0$ for each of the fixed orientations of mirror 92 by monitoring the amplitude of the heterodyne or electrical interference signal.

The conversion factor used for converting the measured change in the orthogonal linear displacement to a fixed reference frame of the lithography tool metrology system is $\cos^2\theta$. Typical ranges of values $\theta$ are of the order of 0.001 radians. Thus for fractional errors of 1 ppb and 0.1 ppb in the conversion factor, the corresponding errors in values of $\theta$ need to be $\leq 5\times 10^{-7}$ and $\leq 5\times 10^{-8}$, respectively. The information on $\theta$ required for application of the conversion factor is obtained in the present invention from the measured changes in pairs of linear displacements.

Figure 7:
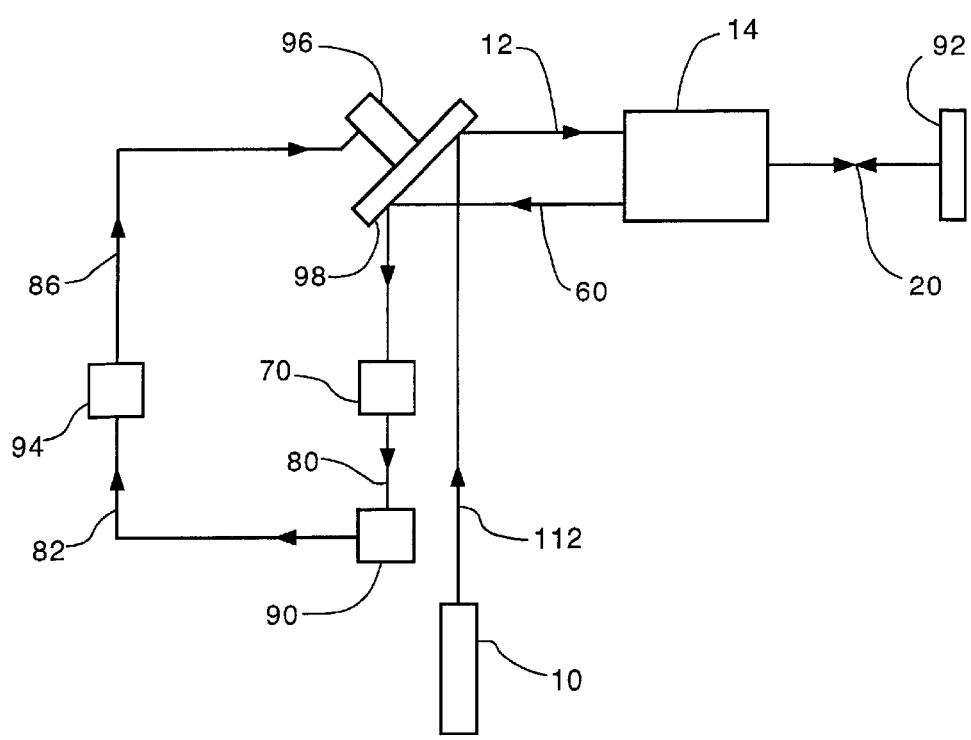
FIG. 7 is a schematic diagram of an interferometry system including dynamic beam steering element positioned to direct an input beam into the interferometer and one or more output beams from the interferometer.

FIG. 7 is a diagrammatic view of an interferometer system by which linear and angular displacements of a plane mirror measurement object 92 are measured and monitored. As shown in FIG. 7, the interferometer system comprises an interferometer 14 which may be structured and arranged as any of the interferometers described herein and a dynamic beam steering element that controls the direction of input beam 12 to interferometer 14 and the direction of output beam 60 to detector 70.

The purpose of changing the direction of input beam 12 and the direction of output beam 60 is to eliminate or substantially reduce the effects of non-cyclic errors in the electrical interference signals generated from output beams of interferometer 14. The elimination or substantial reduction of the effects of non-cyclic errors is achieved by the elimination or the substantial reduction of beam shears in the interferometer and at detector 70 and the elimination or substantial reduction of changes in angle of incidence of beams at detector 70.

The interferometer system further comprises source 10 that produces beam 112, detector 70, servo controller 94, transducer 96, and electronic processor and computer 90. With each interferometer type, interferometer beams travel to and from mirror 92 generally along an optical path designated as 20 and output beams travel from interferometer 14 to detector 70 along an optical path designated as 60. The description of beam 112 is the same as the description of beam 12 of FIG. 1.

The orientation of the beam steering element 98 is controlled by transducer 96 such that the measurement beams that travel along path 20 are incident on mirror 92 with an angle of incidence of zero degrees. Transducer 96 is controlled by servo control signal 86 from servo controller 94. Servo control signal 86 is derived from servo signal 82 that is generated by electronic processor and computer 90.

The description of the interferometer system and dynamic beam steering system shown in FIG. 7 with respect to the errors $\epsilon$ and the conversion factors is the same as the corresponding portion of the description given for the interferometer system and dynamic beam steering system shown in FIG. 6.

We note that in any of the interferometry systems described above, the plane mirror reference object may be integrated into the interferometer assembly. Alternatively, the plane mirror reference object may be part of a second measurement object, such as in a differential plane mirror interferometer. In such embodiments, the interferometer may include additional optics for coupling beams to the reference mirror on the second measurement object.

The interferometry systems described above provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997).

Overlay depends directly on the performance, i.e. accuracy and precision, of the distance measuring interferometers used to position the wafer and reticle (or mask) stages. Since a lithography tool may produce $50–100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 8A:
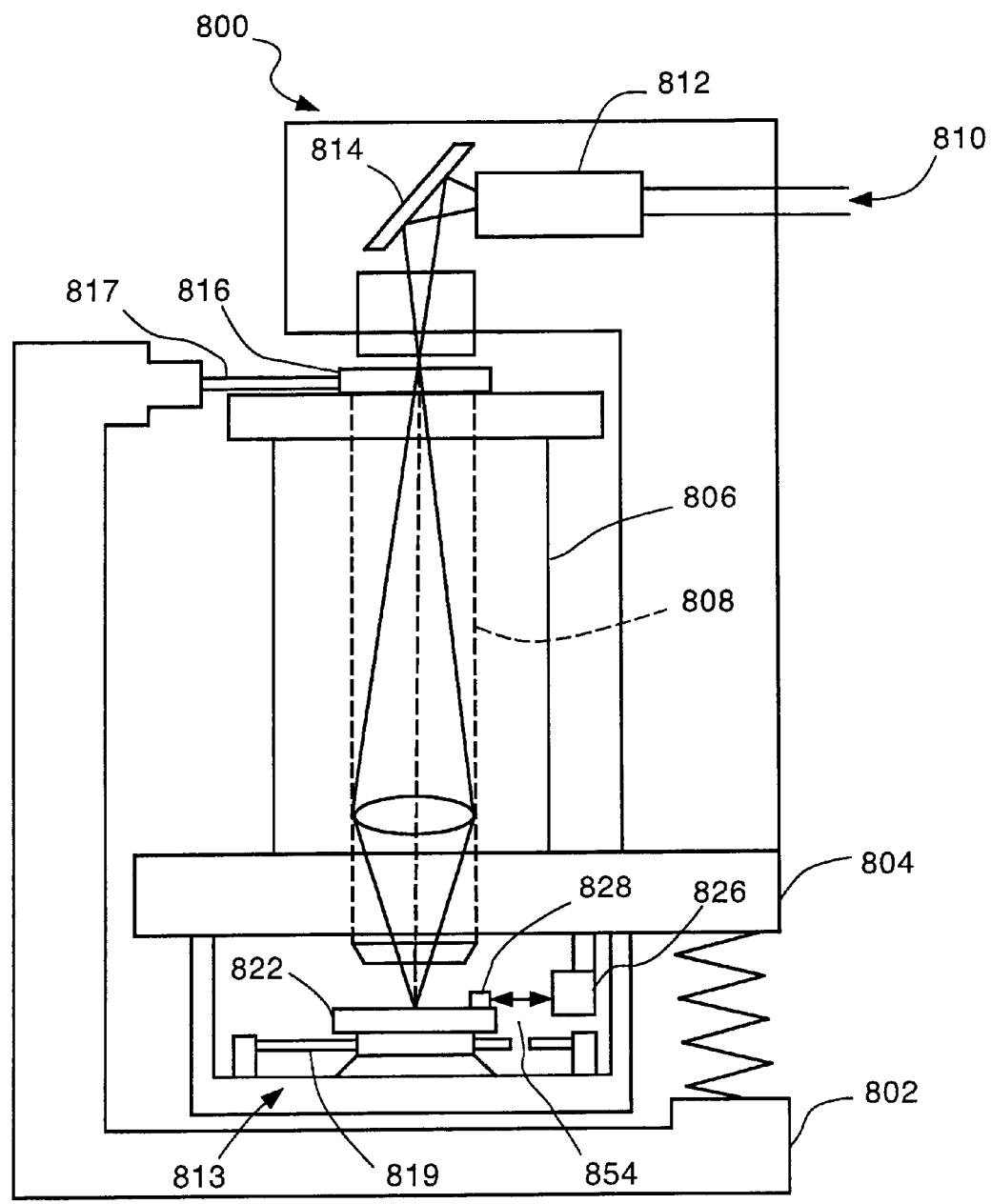
FIG. 8a is a schematic diagram of a lithography system used to make integrated circuits.

An example of a lithography scanner 800 using an interferometry system 826 is shown in FIG. 8a. The interferometry system is used to precisely measure the position of a wafer (not shown) within an exposure system. Here, stage 822 is used to position and support the wafer relative to an exposure station. Scanner 800 includes a frame 802, which carries other support structures and various components carried on those structures. An exposure base 804 has mounted on top of it a lens housing 806 atop of which is mounted a reticle or mask stage 816, which is used to support a reticle or mask. A positioning system for positioning the mask relative to the exposure station is indicated schematically by element 817. Positioning system 817 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 804 is a support base 813 that carries wafer stage 822. Stage 822 includes a plane mirror 828 for reflecting a measurement beam 854 directed to the stage by interferometry system 826. A positioning system for positioning stage 822 relative to interferometry system 826 is indicated schematically by element 819.

Positioning system 819 can include, e.g., piezoelectric transducer elements and corresponding control electronics. The measurement beam reflects back to the interferometry system, which is mounted on exposure base 804. The interferometry system can be any of the embodiments described previously.

During operation, a radiation beam 810, e.g., an ultraviolet (UV) beam from a UV laser (not shown), passes through a beam shaping optics assembly 812 and travels downward after reflecting from mirror 814. Thereafter, the radiation beam passes through a mask (not shown) carried by mask stage 816. The mask (not shown) is imaged onto a wafer (not shown) on wafer stage 822 via a lens assembly 808 carried in a lens housing 806. Base 804 and the various components supported by it are isolated from environmental vibrations by a damping system depicted by spring 820.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 826 directs the reference beam (not shown) along an external reference path that contacts a reference mirror (not shown) mounted on some structure that directs the radiation beam, e.g., lens housing 806. The reference mirror reflects the reference beam back to the interferometry system. The interference signal produce by interferometry system 826 when combining measurement beam 854 reflected from stage 822 and the reference beam reflected from a reference mirror mounted on the lens housing 806 indicates changes in the position of the stage relative to the radiation beam. Furthermore, in other embodiments the interferometry system 826 can be positioned to measure changes in the position of reticle (or mask) stage 816 or other movable components of the scanner system. Finally, the interferometry systems can be used in a similar fashion with lithography systems involving steppers, in addition to, or rather than, scanners.

Figure 8B:
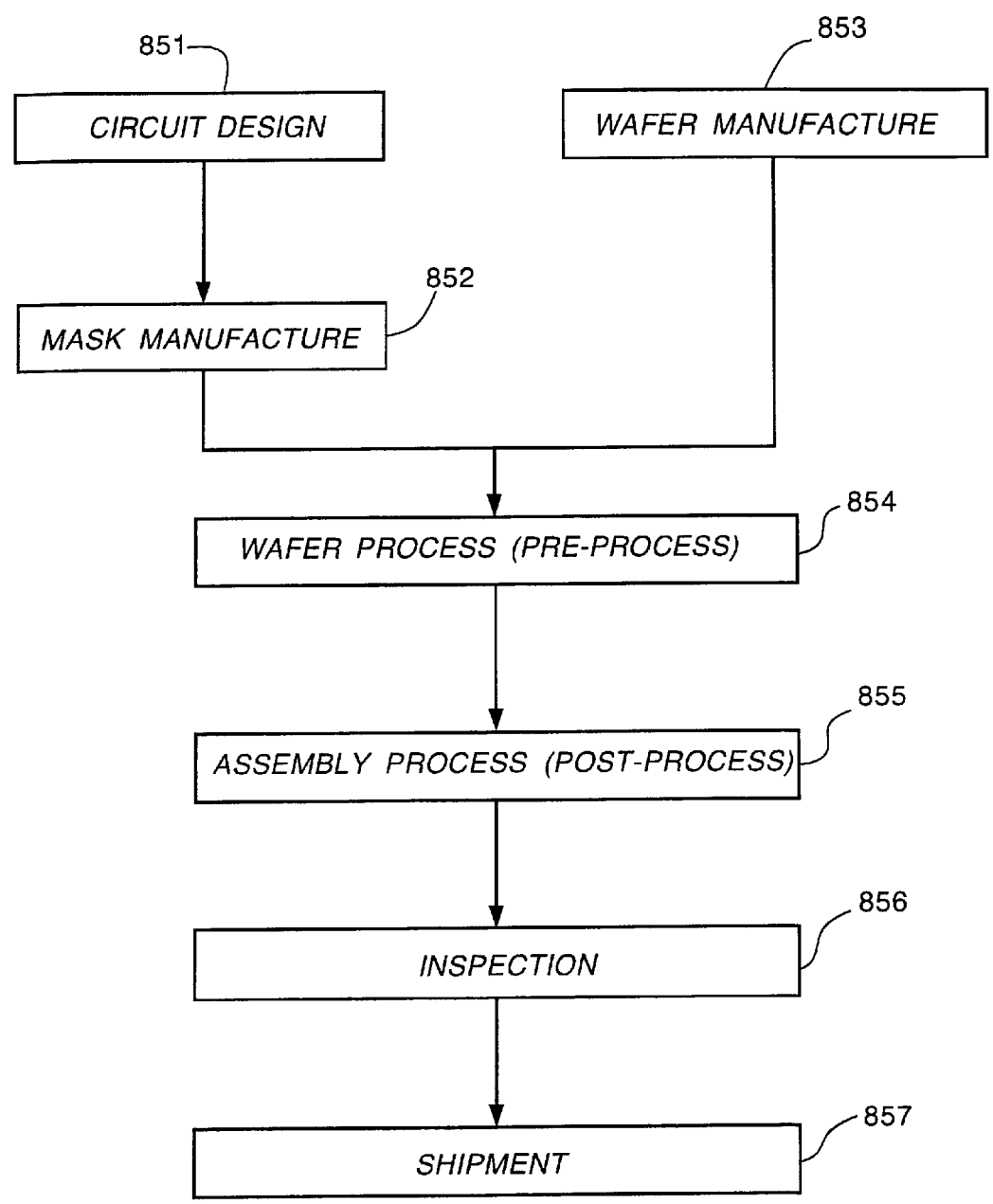
FIGS. 8b–8c are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 8b and 8c. FIG. 8b is a flow chart of the sequence of manufacturing a semiconductor device such as a semiconductor chip (e.g. IC or LSI), a liquid crystal panel or a CCD. Step 851 is a design process for designing the circuit of a semiconductor device. Step 852 is a process for manufacturing a mask on the basis of the circuit pattern design. Step 853 is a process for manufacturing a wafer by using a material such as silicon.

Step 854 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 855 is an assembling step, which is called a post-process wherein the wafer processed by step 854 is formed into semiconductor chips. This step includes assembling (dicing and bonding) and packaging (chip sealing). Step 856 is an inspection step wherein operability check, durability check and so on of the semiconductor devices produced by step 855 are carried out. With these processes, semiconductor devices are finished and they are shipped (step 857).

Figure 8C:
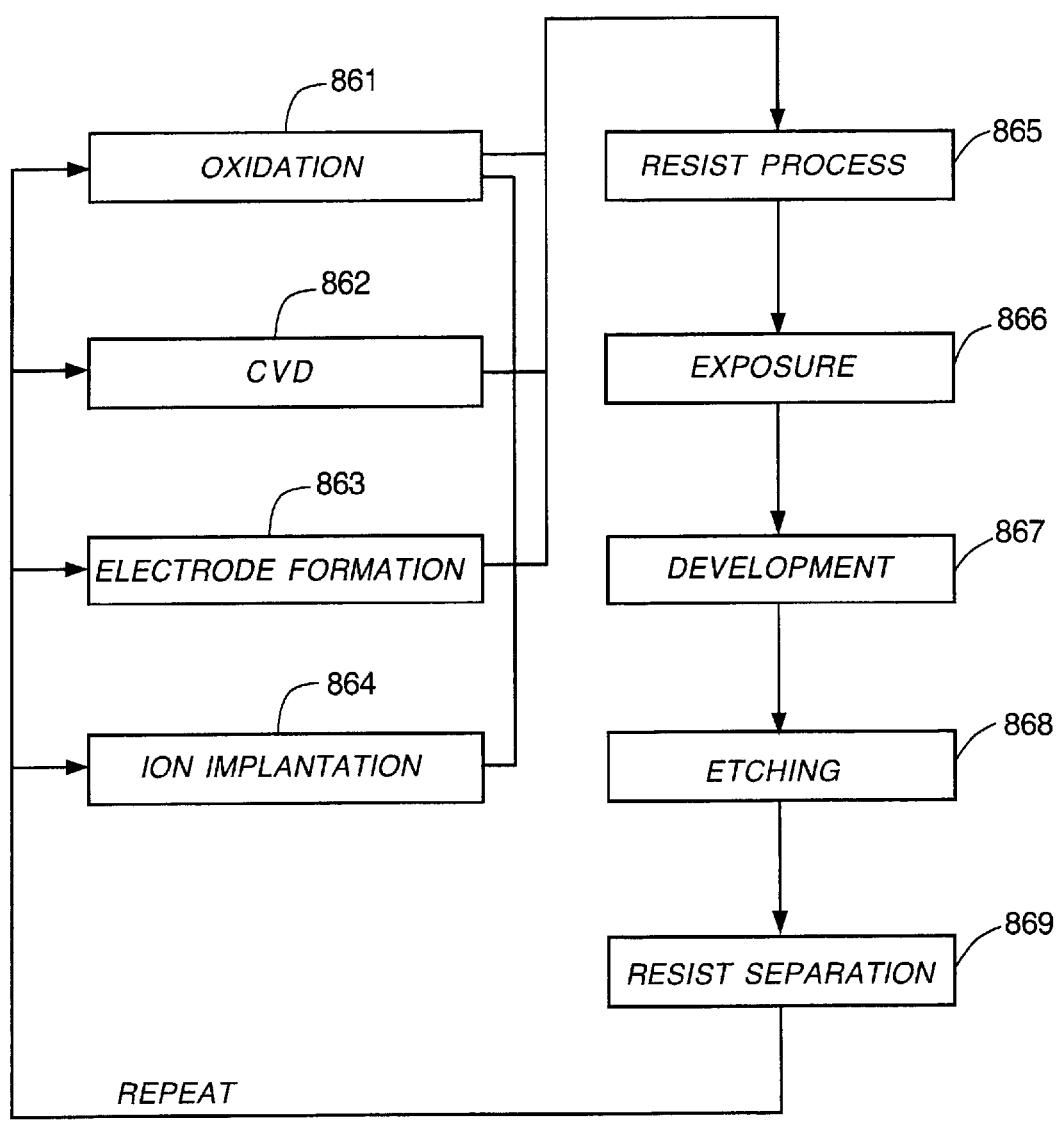

FIG. 8c is a flow chart showing details of the wafer process. Step 861 is an oxidation process for oxidizing the surface of a wafer. Step 862 is a CVD process for forming an insulating film on the wafer surface. Step 863 is an electrode forming process for forming electrodes on the wafer by vapor deposition. Step 864 is an ion implanting process for implanting ions to the wafer. Step 865 is a resist process for applying a resist (photosensitive material) to the wafer. Step 866 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 867 is a developing process for developing the exposed wafer. Step 868 is an etching process for removing portions other than the developed resist image. Step 869 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 9:
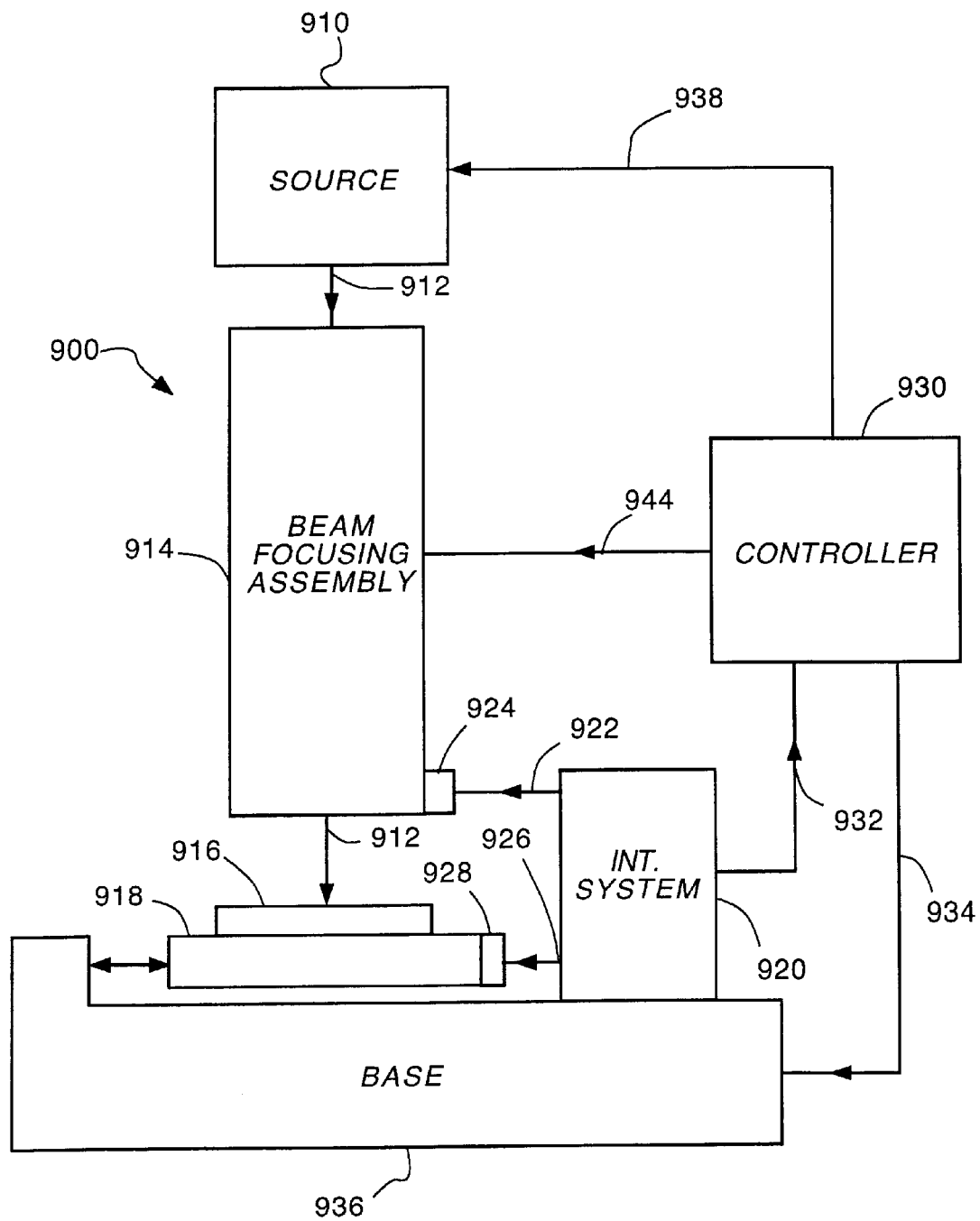
FIG. 9 is a schematic of a beam writing system.

As an example, a schematic of a beam writing system 900 is shown in FIG. 9. A source 910 generates a write beam 912, and a beam focusing assembly 914 directs the radiation beam to a substrate 916 supported by a movable stage 918. To determine the relative position of the stage, an interferometry system 920 directs a reference beam 922 to a mirror 924 mounted on beam focusing assembly 914 and a measurement beam 926 to a mirror 928 mounted on stage 918. Since the reference beam contacts a mirror mounted on the beam focusing assembly, the beam writing system is an example of a system that uses a column reference. Interferometry system 920 can be any of the interferometry systems described previously. Changes in the position measured by the interferometry system correspond to changes in the relative position of write beam 912 on substrate 916.

Interferometry system 920 sends a measurement signal 932 to controller 930 that is indicative of the relative position of write beam 912 on substrate 916. Controller 930 sends an output signal 934 to a base 936 that supports and positions stage 918. In addition, controller 930 sends a signal 938 to source 910 to vary the intensity of, or block, write beam 912 so that the write beam contacts the substrate with an intensity sufficient to cause photophysical or photochemical change only at selected positions of the substrate.

Furthermore, in some embodiments, controller 930 can cause beam focusing assembly 914 to scan the write beam over a region of the substrate, e.g., using signal 944. As a result, controller 930 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrupole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments, features, and advantages are within the scope of the invention.

What is claimed is:

1. An apparatus comprising:
   a multi-axis interferometer for measuring a relative position of a reflective measurement object along multiple degrees of freedom, wherein the interferometer is configured to produce multiple output beams each comprising information about the relative position of the measurement object with respect to a different one of the degrees of freedom, and
   wherein each output beam includes a beam component that contacts the measurement object at least one time along a common path, and
   wherein at least one of the beam components further contacts the measurement object at least a second time along a first path different from the common path.

2. The apparatus of claim 1, wherein the output beam comprising the beam component that contacts the measurement object along the common path and along the first path further comprises a second beam component that does not contact the measurement object.

3. The apparatus of claim 1, wherein one of the degrees of freedom is distance to the measurement object along a first measurement axis.

4. The apparatus of claim 3, wherein the output beam comprising information about the distance to the measurement object along the first measurement axis comprises the beam component that contacts the measurement object along the common path and along the first path.

5. The apparatus of claim 4, wherein the first measurement axis is defined by the common path and the first path.

6. The apparatus of claim 5, wherein each point on the first measurement axis is equidistant to corresponding points on the common path and the first path.

7. The apparatus of claim 4, wherein another of the beam components further contacts the measurement object at least a second time along a second path different from the common path.

8. The apparatus of claim 7, wherein the output beam comprising the beam component that contacts the measurement object along the common path and along the second path comprises information about distance to the measurement object along a second measurement axis defined by the common path and the second path, the second measurement axis being different from the first measurement axis.

9. The apparatus of claim 8, wherein a third of the beam components further contacts the measurement object at least a second time along a third path different from the common path.

10. The apparatus of claim 9, wherein the output beam comprising the beam component that contacts the measurement object along the common path and the third path comprises information about distance to the measurement object along a third measurement axis defined by the common path and the third path, the third measurement axes being different from the first and second measurement axes.

11. The apparatus of claim 10, wherein the first and second measurement axes define a first plane, and the second and third measurement axes define a second plane different from the first plane.

12. The apparatus of claim 4, wherein a second one of the output beams comprises information about an angular orientation of the measurement object with respect to a first rotation axis.

13. The apparatus of claim 12, wherein the second output beam comprises the first-mentioned beam component that contacts the measurement object along the common path and another beam component different from the first beam component, wherein the other beam component contacts the measurement object along a second path different from the common path.

14. The apparatus of claim 13, wherein the first path is different from the second path.

15. The apparatus of claim 14, wherein the first rotation axis is normal to a plane defined by the common path and the second path.

16. The apparatus of claim 13, wherein a third one of the output beams comprises information about an angular orientation of the measurement object with respect to a second rotation axis different from the first rotation axis, and wherein the third output beam comprises the first-mentioned beam component that contacts the measurement object along the common path and another beam component different from the first beam component, wherein the other beam component in the third output beam contacts the measurement object along a third path different from the common path.

17. The apparatus of claim 16, wherein the second rotation axis is normal to the first rotation axis.

18. The apparatus of claim 1, wherein the multi-axis interferometer produces at least four output beams each comprising information about a different one of the multiple degrees of freedom.

19. The apparatus of claim 1, wherein the multi-axis interferometer provides information with respect to at least five degrees of freedom.

20. The apparatus of claim 1, wherein the multi-axis interferometer provides information with respect to at least seven degrees of freedom.

21. The apparatus of claim 1, wherein the measurement object comprises a plane mirror.

22. The apparatus of claim 1, further comprising a light source configured to direct an input beam into the multi-axis interferometer, the input beam comprising two components having an heterodyne frequency splitting, wherein each output beam component that contacts the measurement object along the common path is derived from one of the components in the input beam, and wherein each output beam further comprises a second component derived from the other one of the components in the input beam.

23. The apparatus of claim 22, wherein the components of the input beam have orthogonal polarizations.

24. The apparatus of claim 1, further comprising detectors configured to receive the output beams and generate electrical signals indicative of the information about the relative position of the measurement object with respect to the different degrees of freedom.

25. The apparatus of claim 24, further comprising a polarization analyzer positioned prior to each detector and configured to pass an intermediate polarization to those of the components in each of the output beams.

26. The apparatus of claim 25, further comprising a fiber-optic pick-up for coupling each output beam to a corresponding detector after it passes through the corresponding polarization analyzer.

27. The apparatus of claim 1, wherein the interferometer is configured to direct a first beam derived from an input beam to contact the measurement object along the common path and separate the first beam into multiple sub-beams after it contacts the measurement object, wherein the sub-beams correspond to the beam components in the output beams that contact the measurement object along the common path.

28. The apparatus of claim 27, wherein the interferometer is configured to further direct at least one of the sub-beams to contact the measurement object at least a second time along the first path to define the beam component that contacts the measurement object along the common path and along the first path.

29. The apparatus of claim 28, wherein the interferometer is configured to derive another sub-beam from the input beam and combine the sub-beam that contacts the measurement object at least twice with the other sub-beam to produce a first one of the output beams, wherein the first output beam comprises information about distance to the measurement object along a measurement axis defined by the common path and the first path.

30. The apparatus of claim 28, wherein the interferometer is configured to further direct at least another one of the sub-beams to contact the measurement object at least a second time along a second path different from the common path and different from the first path.

31. The apparatus of claim 30, wherein the interferometer is configured to derive another set of sub-beams from the input beam and combine each of the sub-beams that contacts the measurement object at least twice with a corresponding sub-beam from the other set to produce a corresponding one of the output beams.

32. The apparatus of claim 28, wherein the interferometer is configured to derive another set of sub-beams from the input beam, combine the sub-beam that contacts the measurement object at least twice with one of the sub-beams from the other set to produce one of the output beams, direct another one of the sub-beams from the other set to contact the measurement object along a second path different from the common path, and combine another one of the sub-beams that contact the measurement object along the common path with the sub-beam that contacts the measurement object along the second path to produce another one of the output beams.

33. The apparatus of claim 27, wherein the interferometer is further configured to: i) combine the first beam after it contacts the measurement object with a primary reference beam to define an intermediate beam; ii) separate the intermediate beam into a set of secondary measurement beams and a set of secondary reference beams; iii) direct each of the secondary measurement beams to contact the measurement object; and iv) recombine each secondary measurement beam after it contacts the measurement object with a one of corresponding secondary reference beams to produce a corresponding one of the output beams, wherein each of the sub-beams corresponds to a different one of the secondary measurement and reference beams.

34. The apparatus of claim 1, wherein the interferometer comprises:
a common polarizing beam-splitter positioned to direct a primary measurement beam derived from an incident input beam to contact the measurement object along the common path; and
a return beam assembly configured to receive an intermediate beam comprising the primary measurement beam from the polarizing beam-splitter, separate the intermediate beam into multiple beams, and direct the multiple beams back to the polarizing beam-splitter.

35. The apparatus of claim 34, wherein the polarizing beam-splitter is further positioned to direct a primary reference beam derived from the incident input beam to contact a reflective reference object, wherein the primary measurement beam and primary reference beam correspond to orthogonal polarization components of the incident input beam.

36. The apparatus of claim 35, wherein the polarizing beam-splitter is further positioned to recombine the primary measurement and reference beams to form the intermediate beam after they contact the measurement and reference objects, respectively.

37. The apparatus of claim 36, wherein the polarizing beam-splitter is positioned to: i) separate the multiple beams into a set of secondary measurement beams and a set of secondary reference beams; ii) direct each of the secondary measurement beams to contact the measurement object; iii) direct each of the secondary reference beams to contact the reference object; and iv) recombine each secondary measurement beam with a corresponding one of the secondary reference beams after they contact the measurement and reference objects, respectively, to form a corresponding one of the output beams.

38. The apparatus of claim 37, wherein the each secondary measurement beam contacts the measurement object along a path different from the common the path.

39. The apparatus of claim 37, wherein the interferometer further comprises the reference object.

40. The apparatus of claim 39, wherein the reference object comprises a plane mirror.

41. The apparatus of claim 37, wherein the interferometer further comprises a measurement quarter-wave retarder positioned between the polarizing beam-splitter and the measurement object.

42. The apparatus of claim 41, wherein the interferometer further comprises a reference quarter-wave retarder positioned between the polarizing beam-splitter and the reference object.

43. The apparatus of claim 34, wherein the return beam assembly comprises at least one set of fold optics and at least one non-polarizing beam-splitter positioned to separate the intermediate beam into the multiple beams.

44. The apparatus of claim 43, wherein the at least one set of fold optics comprises a retroreflector positioned to receive the intermediate beam prior to any of the non-polarizing beam-splitters.

45. The apparatus of claim 44, wherein the return beam assembly further comprises a beam-splitting assembly comprising the at least one non-polarizing beam-splitter, wherein the beam-splitting assembly receives the intermediate beam from the retroreflector, generates the multiple beams, and directs the multiple beams back to the polarizing beam splitter along directions parallel to that of the intermediate beam.

46. The apparatus of claim 45, wherein the beam-splitting assembly comprises multiple non-polarizing beam-splitters.

47. The apparatus of claim 46, wherein the return beam assembly further comprises a retardation plate positioned between the retroreflector and the beam-splitting assembly, wherein the retardation plate is oriented to reduce polarization rotation of the intermediate beam caused by the retroreflector.

48. The apparatus of claim 34, wherein the interferometer further comprises an input beam optical assembly comprising a non-polarizing beam-splitter, wherein the input beam optical assembly is configured to separate a progenitor input beam into the first-mentioned input beam and a second input beam propagating parallel to the first input beam and direct the first and second input beams to the polarizing beam-splitter.

49. The apparatus of claim 43, wherein the at least one set of fold optics comprises angle-measuring fold optics and distance-measuring fold optics, wherein the angle-measuring fold optics comprises a half-wave retarder positioned to rotate the polarization of at least one of the multiple beams.

50. The apparatus of claim 49, wherein the angle-measuring fold optics further comprise a penta-prism and the distance-measuring optics comprise a retroreflector.

51. The apparatus of claim 43, wherein non-polarizing beam-splitter is positioned to receive the intermediate beam prior to any of the fold optics.

52. A method comprising:
interferometrically producing multiple output beams each comprising information about a relative position of a measurement object with respect to a different degree of freedom,
wherein each output beam includes a beam component that contacts the measurement object at least one time along a common path, and
wherein at least one of the beam components further contacts the measurement object at least a second time along a first path different from the common path.

53. An apparatus comprising:
a multi-axis interferometer for measuring a relative position of a reflective measurement object along multiple degrees of freedom, wherein the interferometer is configured to produce multiple output beams each comprising information about the relative position of the measurement object with respect to a different one of the degrees of freedom, and
wherein each output beam includes a beam component that contacts the measurement object at least one time along a common path,
wherein at least one of the output beams comprises another beam component different from the first-mentioned beam component, and
wherein the other beam component contacts the measurement object at least one time along a first path different from the common path.

54. The apparatus of claim 53, wherein the output beam comprising the first beam component that contacts the measurement object along the common path and the other beam component that contacts the measurement object along the first path comprises information about the angular orientation of the measurement object with respect to a first rotation axis.

55. The apparatus of claim 54, wherein the first rotation axis is normal to a plane defined by the common path and the first path.

56. The apparatus of claim 54, wherein a second one of the output beams comprises information about an angular orientation of the measurement object with respect to a second rotation axis different from the first rotation axis, and wherein the second output beam comprises the first-mentioned beam component that contacts the measurement object along the common path and another beam component different from the first beam component, wherein the other beam component in the second output beam contacts the measurement object along a second path different from the common path.

57. The apparatus of claim 56, wherein the second rotation axis is normal to the first rotation axis.

58. A method comprising:
   interferometrically producing multiple output beams each comprising information about a relative position of a measurement object with respect to a different degree of freedom,
   wherein each output beam includes a beam component that contacts the measurement object at least one time along a common path,
   wherein at least one of the output beams comprises another beam component different from the first-mentioned beam component, and
   wherein the other beam component contacts the measurement object at least one time along a first path different from the common path.

59. A lithography system for use in fabricating integrated circuits on a wafer, the system comprising:
   a stage for supporting the wafer;
   an illumination system for imaging spatially patterned radiation onto the wafer;
   a positioning system for adjusting the position of the stage relative to the imaged radiation; and
   the apparatus of claim 1 or claim 53 for monitoring the position of the wafer relative to the imaged radiation.

60. A lithography system for use in fabricating integrated circuits on a wafer, the system comprising:
   a stage for supporting the wafer; and
   an illumination system including a radiation source, a mask, a positioning system, a lens assembly, and the apparatus of claim 1 or claim 53,
   wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

61. A beam writing system for use in fabricating a lithography mask, the system comprising:
   a source providing a write beam to pattern a substrate;
   a stage supporting the substrate;
   a beam directing assembly for delivering the write beam to the substrate;
   a positioning system for positioning the stage and beam directing assembly relative one another; and
   the apparatus of claim 1 or claim 53 for monitoring the position of the stage relative to the beam directing assembly.

62. A lithography method for use in fabricating integrated circuits on a wafer, the method comprising:
   supporting the wafer on a moveable stage;
   imaging spatially patterned radiation onto the wafer;
   adjusting the position of the stage; and
   monitoring the position of the stage using the method of claim 52 or claim 58.

63. A lithography method for use in the fabrication of integrated circuits comprising:
   directing input radiation through a mask to produce spatially patterned radiation;
   positioning the mask relative to the input radiation;
   monitoring the position of the mask relative to the input radiation using the method of claim 52 or claim 58; and
   imaging the spatially patterned radiation onto a wafer.

64. A lithography method for fabricating integrated circuits on a wafer comprising:
   positioning a first component of a lithography system relative to a second component of a lithography system to expose the wafer to spatially patterned radiation; and
   monitoring the position of the first component relative to the second component using the method of claim 52 or claim 58.

65. A method for fabricating integrated circuits, the method comprising the lithography method of claim 62.

66. A method for fabricating integrated circuits, the method comprising using the lithography apparatus of claim 59.

67. A method for fabricating a lithography mask, the method comprising:
   directing a write beam to a substrate to pattern the substrate;
   positioning the substrate relative to the write beam; and
   monitoring the position of the substrate relative to the write beam using the interferometry method of claim 53 or claim 58.

68. A method for fabricating integrated circuits, the method comprising the lithography method of claim 63.

69. A method for fabricating integrated circuits, the method comprising the lithography method of claim 64.

70. A method for fabricating integrated circuits, the method comprising using the lithography apparatus of claim 60.

71. An apparatus comprising:
   a multi-axis interferometer for measuring a relative position of a reflective measurement object along multiple degrees of freedom, wherein the interferometer is configured to produce at least three output beams each comprising information about the relative position of the measurement object with respect to a different one of the degrees of freedom, and
   wherein each output beam includes a beam component that contacts the measurement object at least one time along a common path, and
   wherein at least one of the beam components further contacts the measurement object at least a second time along a first path different from the common path.

72. An apparatus comprising:
   a multi-axis interferometer for measuring a relative position of a reflective measurement object along multiple degrees of freedom, wherein the interferometer is configured to produce multiple output beams each comprising information about the relative position of the measurement object with respect to a different one of the degrees of freedom, and
   wherein each output beam includes a beam component that contacts the measurement object at least one time along a common path, wherein one of the beam components further contacts the measurement object at least a second time along a first path different from the common path, and wherein another of the beam components further contacts the measurement object at least a second time along a second path different from the common path and the first path.

73. An apparatus comprising:

a multi-axis interferometer for measuring a relative position of a reflective measurement object along multiple degrees of freedom, wherein the interferometer is configured to produce multiple output beams each comprising information about the relative position of the measurement object with respect to a different one of the degrees of freedom, and wherein each output beam includes a beam component that contacts the measurement object at least one time along a common path, wherein at least one of the output beams comprises another beam component different from the first-mentioned beam component, wherein the other beam component contacts the measurement object at least one time along a first path different from the common path, and wherein the two beam components in the at least one output beam each make pass to a common, reflective reference object.

* * * * *

UNITED STATES PATENT AND TRADEMARK OFFICE
CERTIFICATE OF CORRECTION

PATENT NO. : 6,757,066 B2
DATED : June 29, 2004
INVENTOR(S) : Henry A. Hill

It is certified that error appears in the above-identified patent and that said Letters Patent is hereby corrected as shown below:

<u>Title page,</u>
Item [56] References Cited, U.S. PATENT DOCUMENTS,
"5,575,160" reference, replace "11/1996" with -- 5/1998 --

<u>Column 37,</u>
Line 6, replace "axes" with -- axis --

<u>Column 41,</u>
Line 8, insert -- to -- after "relative"

Signed and Sealed this

Seventh Day of June, 2005

JON W. DUDAS
*Director of the United States Patent and Trademark Office*